(12) United States Patent
Jaggar et al.

(10) Patent No.: US 6,343,358 B1
(45) Date of Patent: Jan. 29, 2002

(54) EXECUTING MULTIPLE DEBUG INSTRUCTIONS

(75) Inventors: David Vivian Jaggar, Austin; William Adam Hohl, Pflugerville; James Stroman Hall, Lubbock, all of TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 09/314,024

(22) Filed: May 19, 1999

(51) Int. Cl.$^7$ .......................... G06F 9/44; G06F 11/34; G06F 11/08; H05K 10/00; G01R 31/28
(52) U.S. Cl. .......................... 712/227; 712/36; 712/34; 714/30; 714/18; 714/727; 714/726; 714/729; 713/601
(58) Field of Search .......................... 714/30, 18, 727, 714/726, 729, 733, 23; 324/23.1; 712/36, 30, 227, 35, 34, 37, 209, 210, 217, 201, 218, 213, 242.43, 243.36, 244.3, 248.35, 300

(56) References Cited

U.S. PATENT DOCUMENTS 5,297,276 A    3/1994  Millar et al. .................. 714/23
5,404,359 A  * 4/1995  Gillenwater et al. ......... 714/733
5,530,504 A    6/1996  Edgington .................... 714/30
6,073,254 A  * 6/2000  Whetsel ....................... 714/30

FOREIGN PATENT DOCUMENTS

EP    762 280     3/1997
GB    2 338 320   12/1999

* cited by examiner

Primary Examiner—Daniel H. Pan
(74) Attorney, Agent, or Firm—Nixon & Vanderhye P.C.

(57) ABSTRACT

Apparatus for processing data is provided, said apparatus comprising: a main processor 4; an instruction transfer register ITR for holding a data processing instruction and accessible via a first serial scan chain SC4; a data transfer register DTR for holding a data value and accessible via a second serial scan chain SC5; debug logic 6, 12 for controlling said main processor 4, said instruction transfer register ITR and said data transfer register DTR such that a data processing instruction held within said instruction transfer register ITR is passed a plurality of times to said main processor 4 for execution upon a sequence of data values scanned into or from said data transfer register via said second serial scan chain. In this way operational speed of the debug mode is increased since the data processing instruction only needs to be transferred once.

19 Claims, 9 Drawing Sheets

EXECUTING MULTIPLE DEBUG INSTRUCTIONS

BACKGROUND OF THE INVENTION

1. Field of the Invention

This invention relates to the field of data processing systems. More particularly, this invention relates to data processing systems including debug mechanisms where it is desired to execute multiple debug instructions.

2. Description of the Prior Art

It is known to provide data processing systems with debug mechanisms for assisting in the debugging of hardware and software. One known technique is to use JTAG serial scan chains to scan in instructions and data to be applied to the system being debugged. It is generally slow to scan in large numbers of instructions and data values via serial scan chains.

SUMMARY OF THE INVENTION

Viewed from one aspect the present invention provides an apparatus for processing data, said apparatus comprising:

a main processor;

an instruction transfer register for holding a data processing instruction and accessible via a first serial scan chain;

a data transfer register for holding a data value and accessible via a second serial scan chain;

debug logic for controlling said main processor, said instruction transfer register and said data transfer register such that a data processing instruction held within said instruction transfer register is passed a plurality of times to said main processor for execution upon a sequence of data values scanned into or from said data transfer register via said second serial scan chain.

The invention recognizes that in many circumstances the same instruction will be executed many times consecutively. In this circumstance, a significant increase in speed can be achieved by using separate scan chains for the instruction transfer and the data transfer whereby once the instruction has been scanned into place it can be left there and only the data values that change upon each execution need to be transferred via their separate scan chain. It will be appreciated that depending upon the particular instruction being executed, the data values may be transferred into the data transfer register or transferred out of the data transfer register.

Whilst the instruction being repeatedly executed could have many different forms, the present technique is particularly useful when the instruction is a memory access instruction. Memory access instructions often are repeatedly executed to provide block data transfers.

The implementation of the present technique is eased in embodiments in which the data transfer register is an addressable register that may be specified as an operand within one or more data processing instructions. In this way the degree of change required in the rest of the system to carry the present technique can be reduced.

Whilst the debug logic could have many forms it is preferred that the debug logic includes a debug coprocessor coupled to the main processor by a coprocessor interface.

In order to reduce potential data conflicts due to the main processor and the debug logic both trying to access the data transfer register at the same time, in preferred embodiments the data transfer register is in the form of two registers forming a bidirectional communications channel.

In preferred embodiments of the invention said data transfer register includes an instruction complete flag settable by said main processor for indicating that said data processing instruction has completed an execution iteration. In this way external debug circuitry may poll this flag after it has issued an instruction to determine when the instruction has completed and that it write more data to or read more data from the data transfer register. The scan chain controller may already be set to have the second serial scan selected as the active scan chain and so the polling can be quickly performed and a subsequent transfer will not require a change of active scan chain to be made.

As a way of increasing efficiency further, in preferred embodiments said second serial scan chain is operable to output bits of a data value to be transferred out of said data transfer register at the same time as storing bits of a data value to be transferred into said data transfer register. In this way each serial scan chain bit shift both loads in one bit of data and outputs one bit of data in a manner that reduces the time needed for transferring words of data into and out of the system.

Viewed from another aspect the present invention provides a method of processing data, said method comprising the steps of:

holding a data processing instruction accessible via a first serial scan chain in an instruction transfer register;

holding a data value and accessible via a second serial scan chain in a data transfer register;

controlling a main processor, said instruction transfer register and said data transfer register such that a data processing instruction held within said instruction transfer register is passed a plurality of times to said main processor for execution upon a sequence of data values scanned into or from said data transfer register via said second serial scan chain.

BRIEF DESCRIPTION OF THE DRAWINGS

The present invention will be described, further by way of example only, with reference to a preferred embodiment thereof as illustrated in the accompanying drawings, in which.

DESCRIPTION OF A PREFERRED EMBODIMENT

Figure 1:
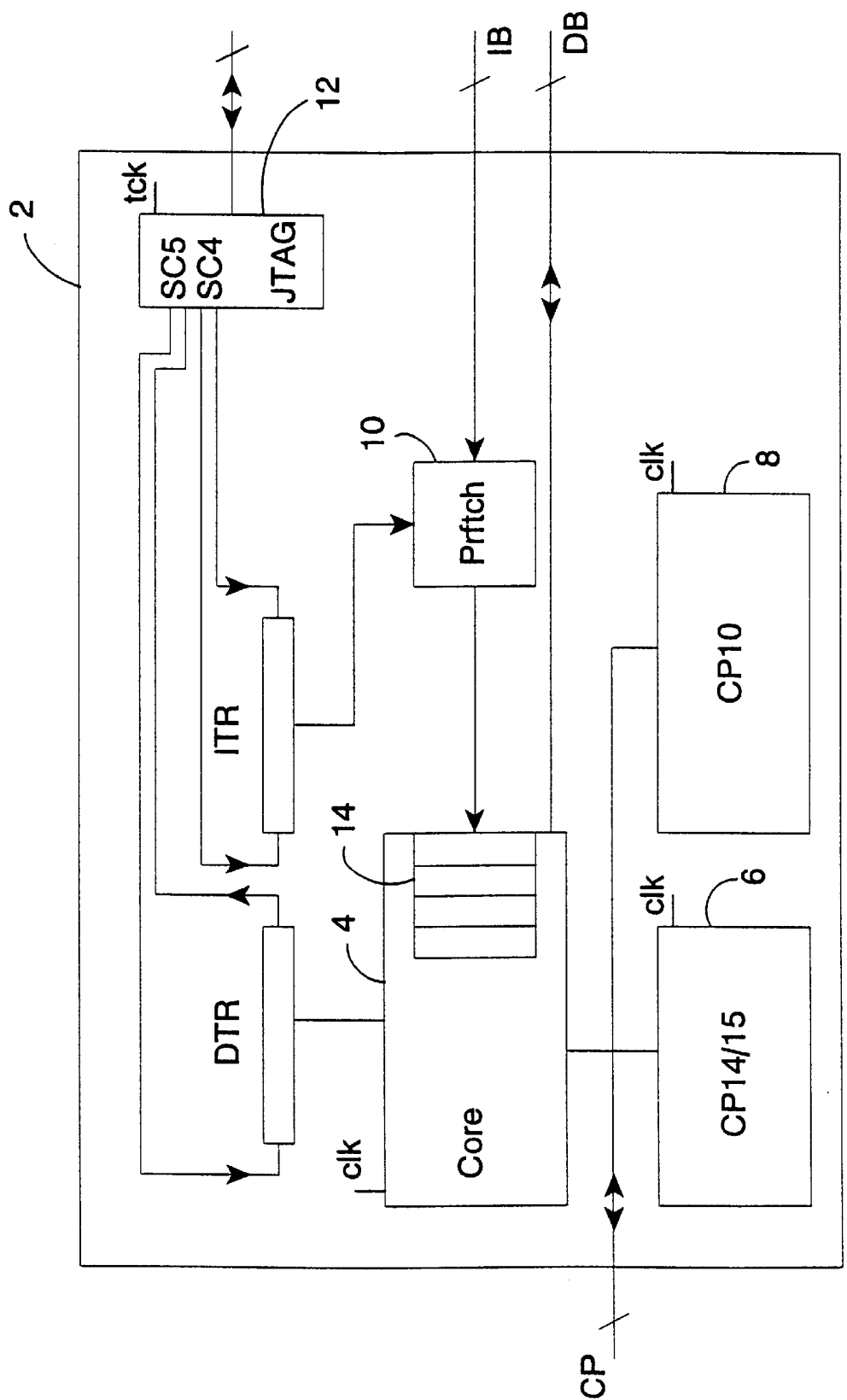
FIG. 1 schematically illustrates a data processing system including a debug mechanism.

FIG. 1 shows a data processing system 2 that includes a main processor 4, a debug coprocessor (and system coprocessor) 6 and a floating point unit coprocessor 8. The main processor 4 is coupled via a coprocessor interface in the form of a coprocessor bus CP to the debug coprocessor 6 and the floating point unit coprocessor 8. The form of this coprocessor bus CP is substantially the same as a standard coprocessor bus, such as the ARM coprocessor bus (as used with microprocessors produced by ARM Limited of Cambridge, England).

The main processor 4 is coupled to a data bus DB and via a prefetch unit 10 to an instruction bus IB. The data bus DB and the instruction bus IB both include address portions that are monitored by the debug coprocessor 6 to identify breakpoints and watchpoints respectively.

The main processor 4, the debug coprocessor 6 and the floating point unit coprocessor 8 are all driven by a common main processor clock signal clk at a main processor clock frequency. A scan chain controller 12 also forms part of the debug logic together with the debug coprocessor. The scan chain controller 12 is driven by a debug clock signal tck that has a typically different frequency to the main processor clock signal clk and is asynchronous with the main processor clock signal clk.

A data transfer register DTR and an instruction transfer register ITR are coupled to the scan chain controller 12 such that they may both be written to and read from via separate serial scan chains. Whilst not illustrated, in some modes the separate scan chains of the data transfer register DTR and the instruction transfer register ITR may be joined together to form a single scan chain. The scan chain controller 12 is of the type specified in the IEEE 1149.1 JTAG standard. The system is controlled such that whenever the scan chain controller 12 passes through the Run-Test/Idle state within the TAP controller states, the instruction transfer register ITR issues its contents to the prefetch unit 10 as an instruction to be passed to the pipeline 14 of the main processor 4 to be executed by asserting a valid instruction line. It will be appreciated that the instruction passed from the prefetch unit 10 to the main processor 4 may be an instruction that is executed by the main processor 4 itself or one that is intended for one of the coprocessors 6, 8 coupled via the coprocessor bus CP to the main processor 4.

Two public instructions HALT and RESTART have been added to the normal JTAG instruction set to halt and restart the main processor's normal operations as will be discussed further below.

Figure 2:
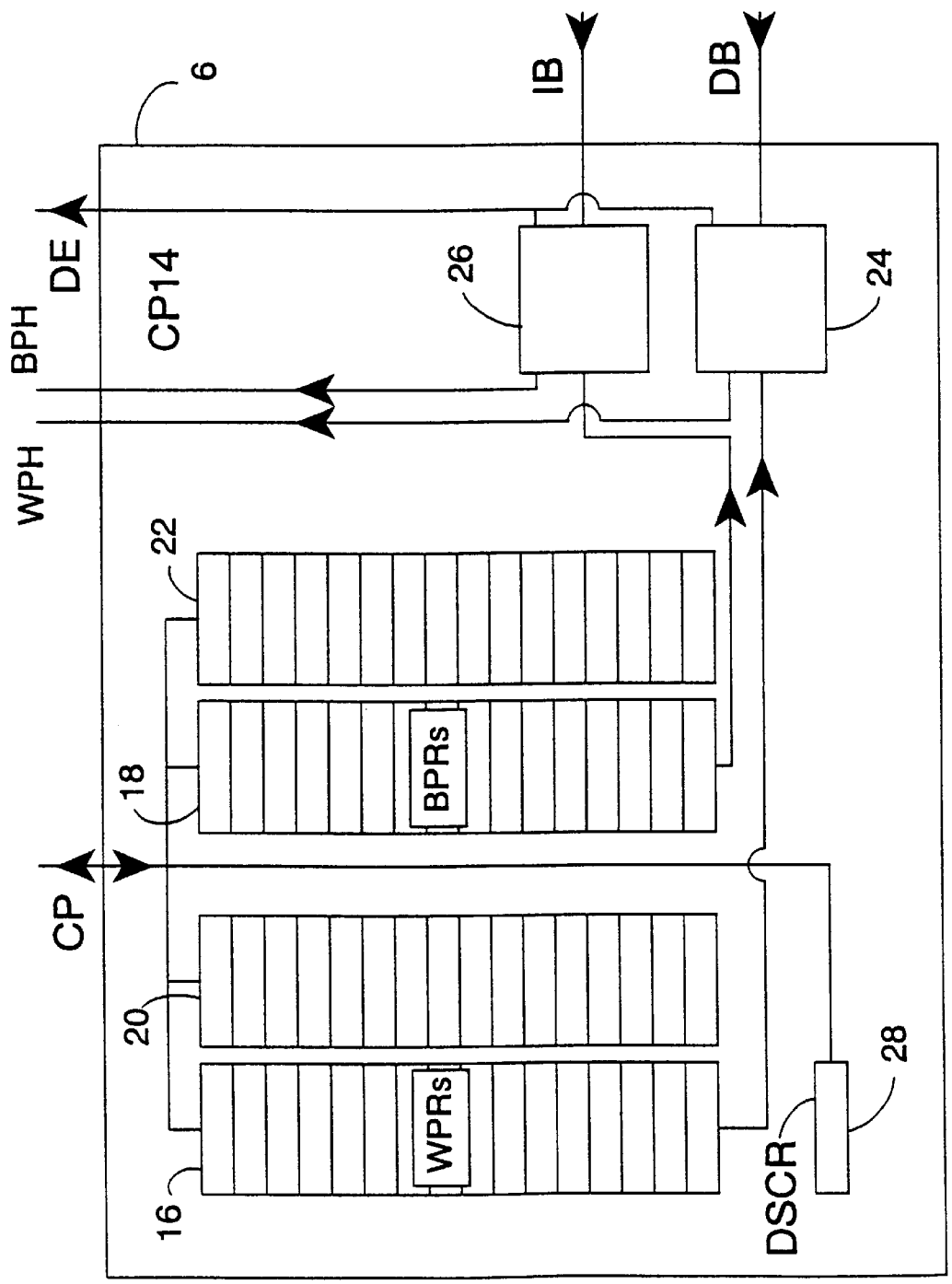
FIG. 2 schematically illustrates a debug coprocessor that is part of the debug mechanism of the data processing system of FIG. 1.

FIG. 2 illustrates the debug coprocessor 6 in more detail. Coprocessor instructions intended to be executed by a coprocessor rather than the main processor 4 include a coprocessor number operand field. In this way only the coprocessor with the matching coprocessor number will respond to the coprocessor instruction and execute it. In the present case, the debug coprocessor is given the number CP14. The system coprocessor normally associated with an ARM main processor is given the coprocessor number CP15 and contains various control registers. FIG. 2 illustrates the debug coprocessor CP14.

The debug coprocessor 6 includes a bank of watchpoint registers 16 and a bank of breakpoint registers 18. These registers 16, 18 within the debug coprocessor 6 respectively store watchpoint addresses and breakpoint addresses. Associated with each watchpoint register 16 and breakpoint register 18 is a respective control register 20, 22. These control registers 20, 22 store control data such as mask values to be applied to the comparisons of the instruction bus IB and the data bus DB to the respective breakpoint and watchpoint values. The control registers can also store a flag to enable or disabled their associated breakpoint or watchpoint as well as a value indicating in which modes of operation that breakpoint or watchpoint is active.

The watchpoint values from the watchpoint registers 16 are compared by respective watchpoint comparators 24 with data addresses on the data bus DB whilst breakpoint values from the breakpoint registers 18 are compared by respective breakpoint comparators 26 with instruction addresses on the instruction bus IB. If a watchpoint match or a breakpoint match is identified, then this is indicated to the rest of the circuit by a watchpoint hit signal WPH or a breakpoint hit signal BPH. A debug enable signal DE is also generated. The watchpoint hit signal WPH, the breakpoint hit signal BPH and the debug enable signal DE can be considered part of the interface which exists between the debug coprocessor 6 and the main processor 4, and may include additional signals to indicate main processor status, to indicate the core should halt or to indicate that the core should restart.

The debug coprocessor 6 also includes a debug status control register DSCR that is coupled to the coprocessor bus CP. All of the registers 16, 18, 20, 22, 28 discussed above can be both written to and read from by coprocessor instructions such as ARM MCR and MRC instructions. This enables the debug coprocessor to be configured via the coprocessor interface without having to add additional circuitry into the main processor 4, with its associated potential for slowing critical paths.

Figure 3:
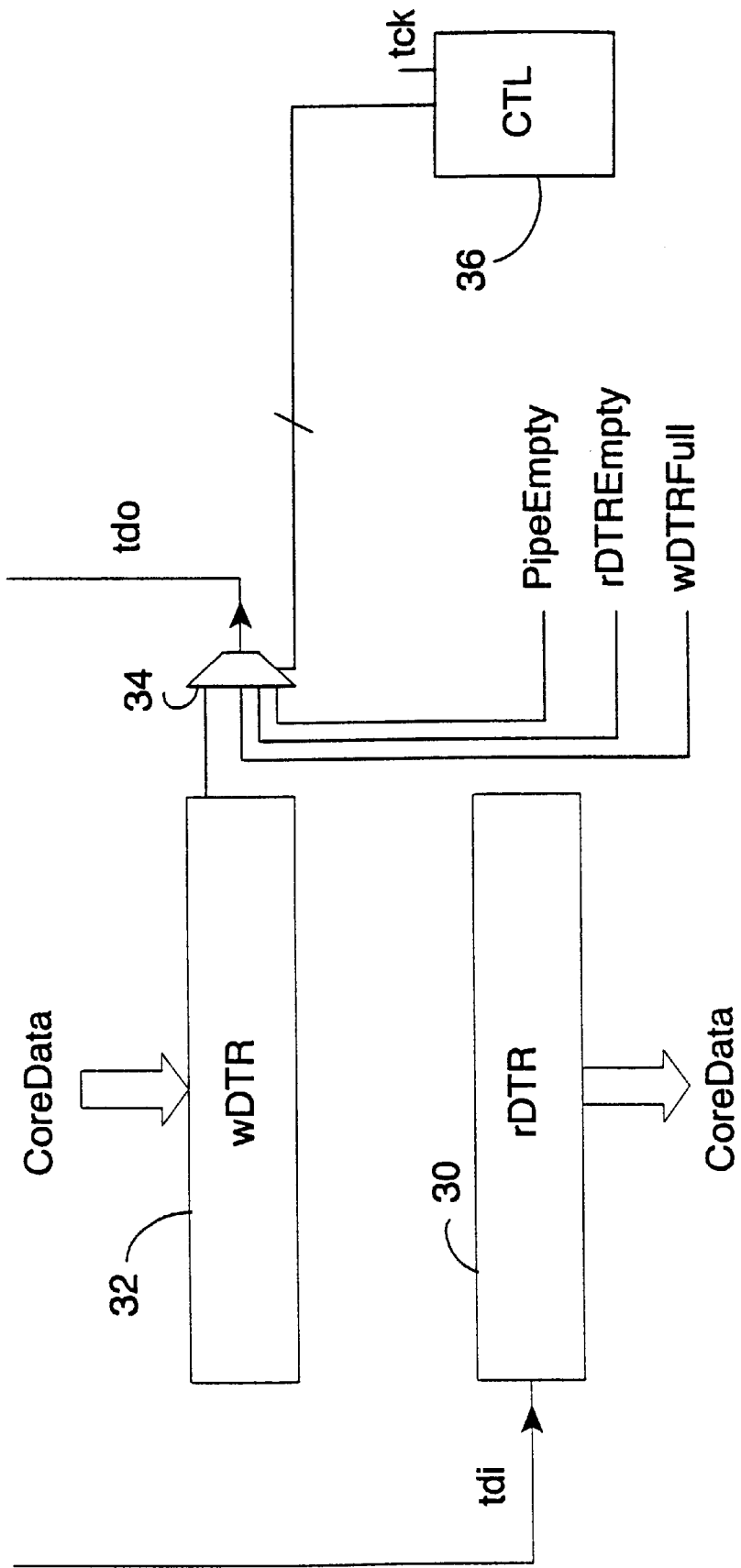
FIG. 3 schematically illustrates a data transfer register that is part of the debug mechanism of the data processing system of FIG. 1.

FIG. 3 illustrates the data transfer register DTR in more detail. In particular, the data transfer register DTR is formed of two registers 30, 32. The first register 30 is writable via the scan chain input tdi and readable by the main processor 4. The second register 32 is readable via the scan chain output tdo and is writable by the main processor 4. Together the first register 30 and the second register 32 form a bidirectional communications channel in which conflicting writes cannot occur.

The second register 32 stores thirty two bits of data and has a 33rd bit formed by the multiplexer 34. The multiplexer 34 operates under control of a controller 36 to select one of four inputs. The first input is the output from the main portion of the second register 32 and this is selected when serially scanning out the contents of the main portion of the second register 32. The other three inputs to the multiplexer 34 handle handshaking between the portion of the system operating in the main processor clock signal clk domain and the portion of the system operating in the debug clock signal tck domain. In particular, these signals are arranged such that they may be read by external debug circuitry via the tdo output to prevent the data transfer register from being read to external debug circuitry before it is full and similarly to prevent the data transfer register from being read by the main processor 4 until it has been properly loaded. Furthermore, the external debug circuitry can read the 33rd bit to determine whether data that it has placed within the data transfer register DTR has been used by the main processor 4 before a further attempt is made to load data into the data transfer register DTR. The same is true of preventing the main processor 4 trying to load data into the data transfer register DTR before it has been collected by the external debug circuitry. A PipeEmpty signal may also be selected by the multiplexer 34 as the 33rd bit pollable by the debug system to determine that the instruction pipeline 14 of the main processor 4 is empty with no pending instructions to be executed.

In operation, as data is being serially scanned into the first register 30 on line tdi, data bits from the second register 32 are scanned out on line tdo. The converse is also true in that as data is being serially scanned out of the second register 32 on line tdo, data bits are input to the first register 30 on line tdi. Thus, data may be simultaneously recovered from and written to the data transfer register DTR thereby increasing the speed of debug operations.

Figure 4:
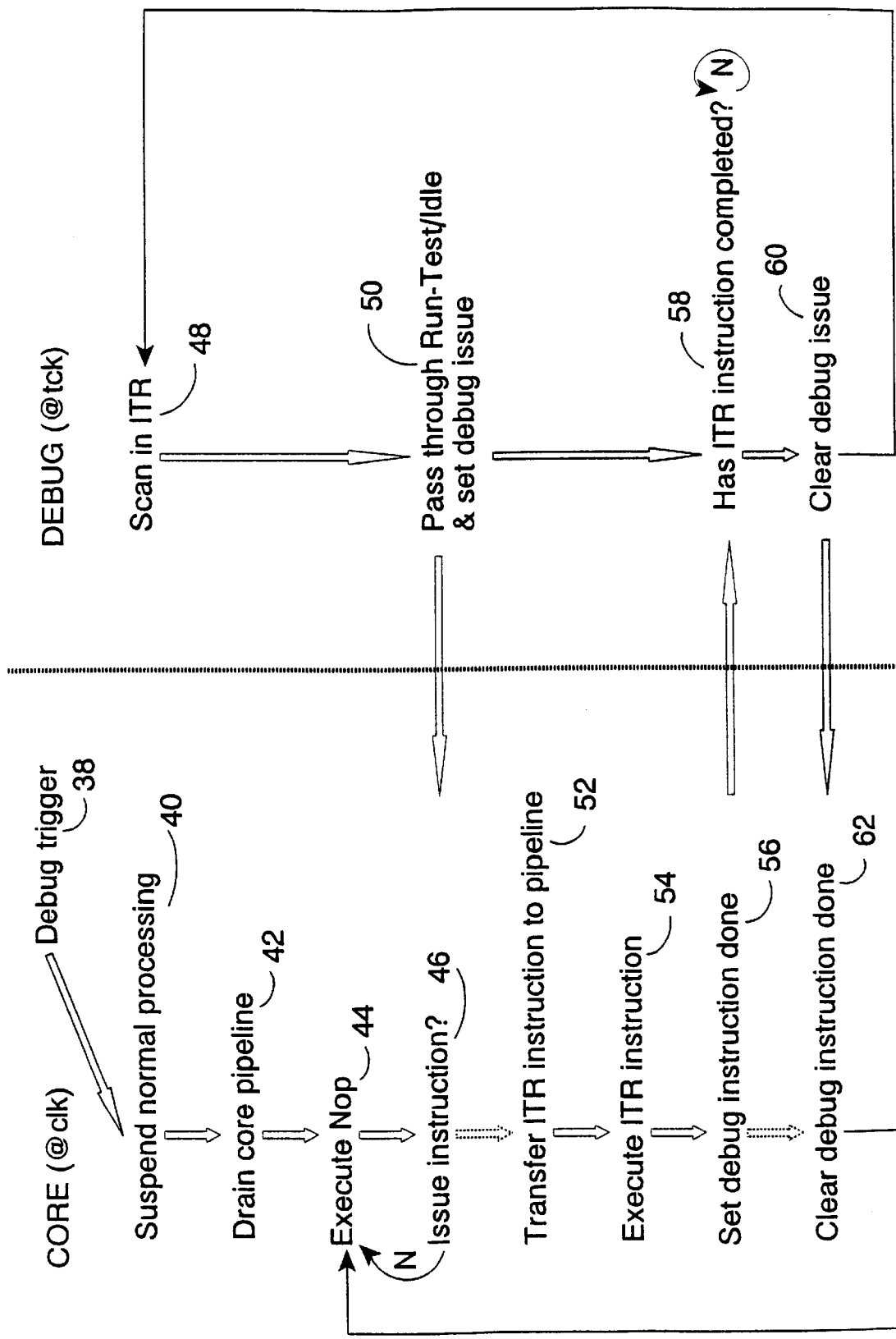
FIG. 4 illustrates execution of a debug instruction.

FIG. 4 illustrates execution of a debug instruction supplied to the main processor 4 by the scan chain controller 12. The main processor 4 continues to be driven by the main processor clock signal clk with the scan chain controller being driven by the debug clock signal tck. At step 38 a debug trigger occurs, such as the execution of a breakpoint instruction, an externally applied breakpoint signal or detection of a breakpoint or watchpoint trigger. The debug trigger causes the main processor 4 to suspend normal processing at step 40. The pipeline 14 then drains of existing instructions during step 42 prior to executing a sequence of no-operation instructions in the loop formed of steps 44, 46. Step 46 checks whether the scan chain controller 12 has indicated (in this embodiment as a result of passing through the Run-Test/Idle state) that the contents of the instruction transfer register ITR should be issued as an instruction into the pipeline 14.

Prior to step 46 being passed, the debug side of the system, which includes the scan chain system, operating under control of the debug clock signal tck serves to first scan in an instruction into the instruction transfer register ITR at step 48. When the instruction has been scanned in, the scan chain controller is moved through the Run-Test/Idle state at step 50 which indicates to the main processor side of the system that an instruction is ready in the instruction transfer register ITR to be issued down the pipeline 14.

When step 50 has completed, step 52 serves to transfer the instruction from the instruction transfer register ITR into the pipeline 14 from where it is executed at step 54. When the instruction has completed, a debug instruction done signal is passed back to the debug side (step 56) so that the debug side knows that the instruction it placed in the instruction transfer register ITR has been completed and that further instructions can be placed into the instruction transfer register ITR if desired. The debug side notes the issue of the debug instruction done signal at step 58 and at step 60 clears the signal it asserted to indicate that there is a valid instruction waiting to be executed within the instruction transfer register ITR. The main processor side notes the clearing of the signal by the debug side at step 62 and then returns processing to the loop 44, 46. The steps 56, 58, 60, 62 effectively perform a handshaking operation between the portions operating within different clock domains thereby accommodating the frequency difference and the unknown phase relationship.

Thus, it will be seen that the debug portion of the circuit operates with a debug clock signal tck whilst the main processor portion of the circuit operates with the main processor clock signal clk and copes with the different clock rates by executing no-operation instructions and by the handshaking processes.

Figure 5:
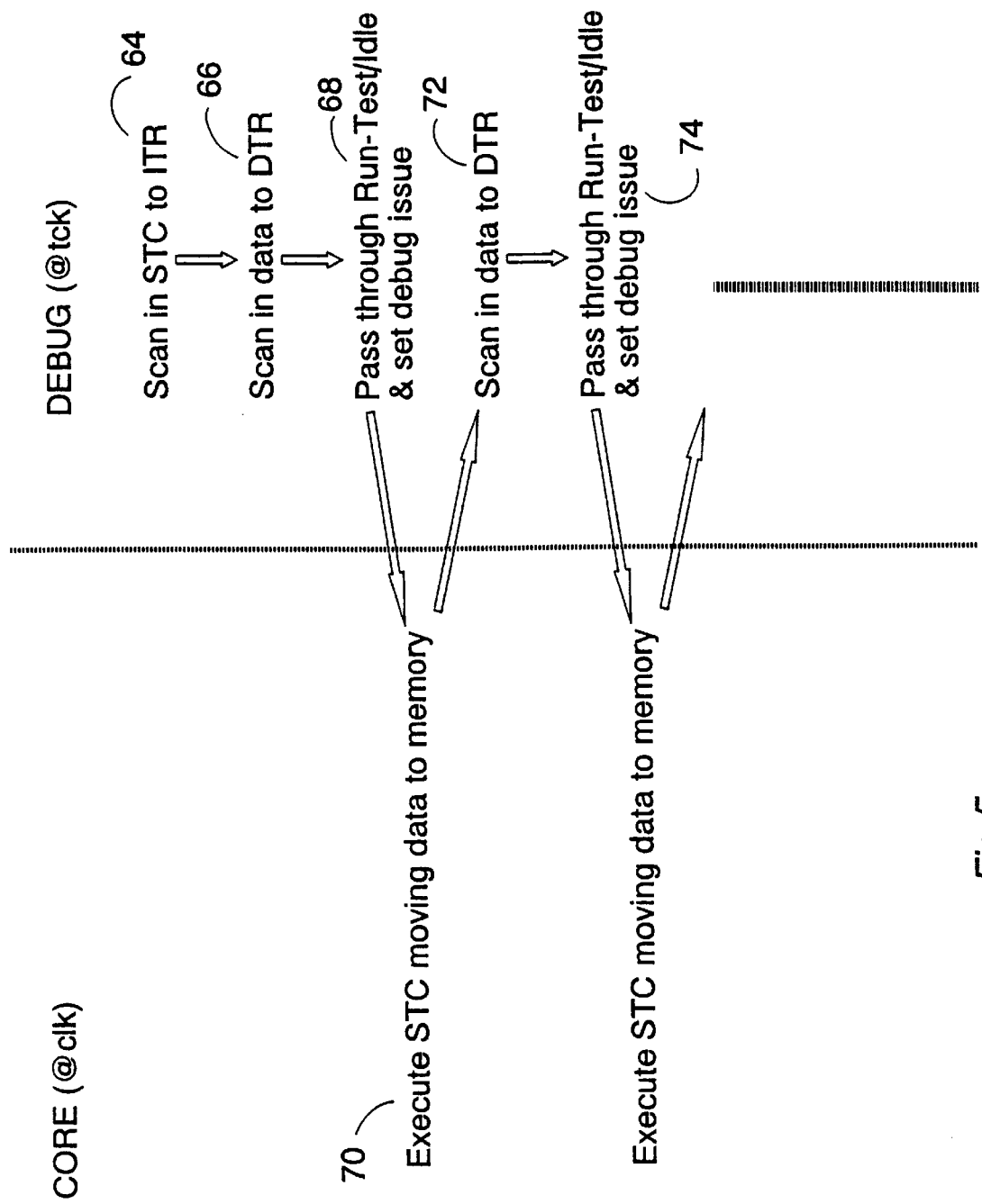
FIG. 5 illustrates repeated execution of a debug instruction.

FIG. 5 illustrates the multiple execution of a debug instruction. At step 64 an instruction such as an ARM STC instruction is scanned into the instruction transfer register ITR. At step 66, a data value is scanned into the data transfer register DTR. At step 68, the scan chain controller 12 is moved through the Run-Test/Idle state and the debug instruction issue signal is set. The main processor side detects the setting of the debug instruction issue signal and at step 70 executes the instruction stored in the instruction transfer register ITR (see FIG. 4) by moving the data value from the data transfer register DTR to a memory (memory circuit not shown). When this instruction has completed, this is indicated back to the debug side which scans in a further data value to the data transfer register at step 72. The instruction stored within the instruction transfer register ITR does not need to be changed by the external system and so no time is consumed in transferring in another instruction. When the next data value is in place, the scan chain controller 12 is moved through the Run-Test/Idle state at step 74 and the processes continues. Steps identical to steps 68 and 70 can be performed a large number of times to efficiently perform a block memory transfer.

Figure 6:
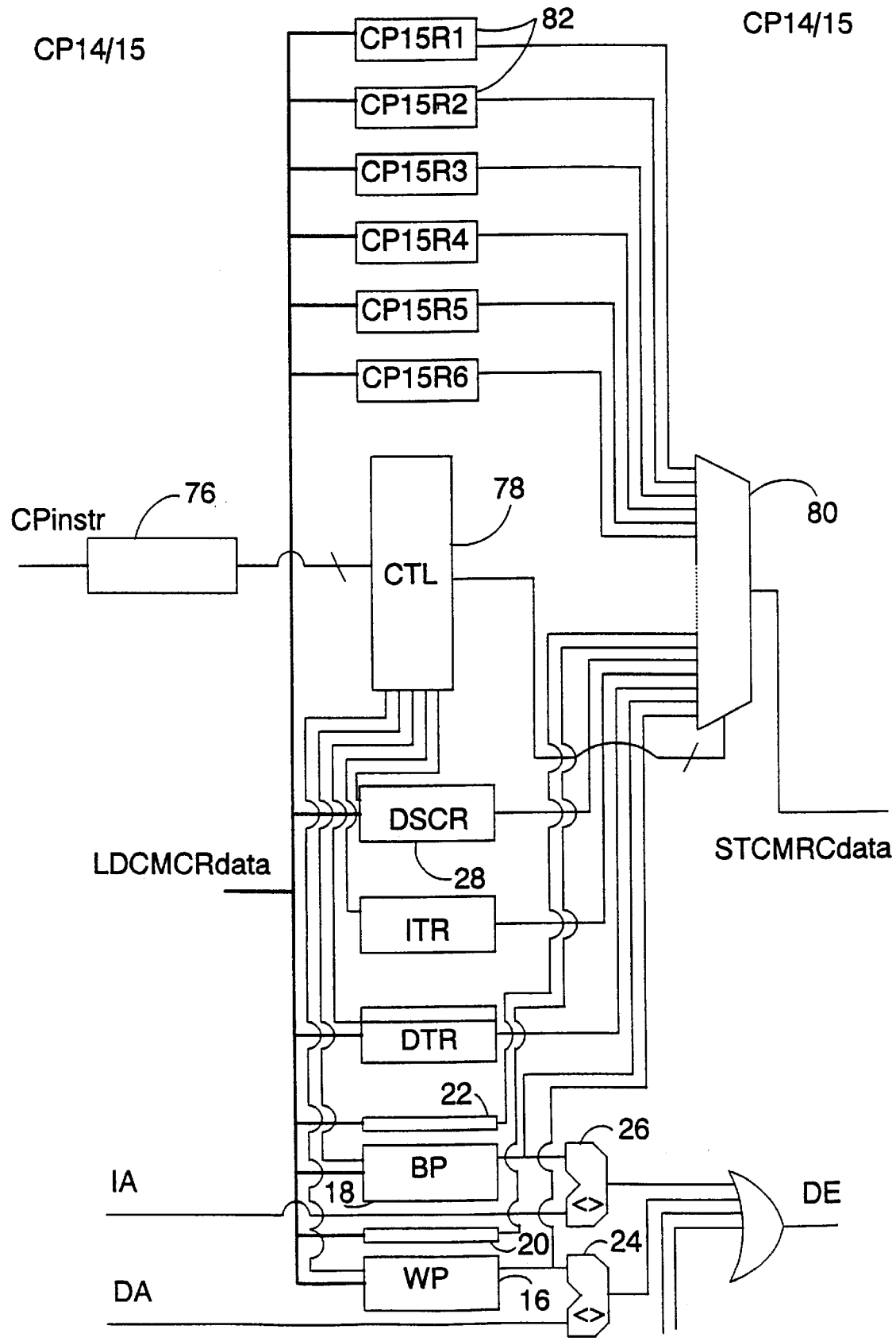
FIG. 6 shows an alternative view of the debug coprocessor of FIG. 2.

FIG. 6 illustrates in an alternative way a portion of the debug coprocessor 6. A coprocessor instruction is passed to the debug coprocessor 6 via the bus CPinstr from where it is registered into an instruction register 76. The latched instruction is passed to a decoder 78 which in turn generates control signals for the various registers of the debug coprocessor 6 and the output multiplexer 80. Register writes are made in response to ARM MCR instructions and register reads are made in response to ARM MRC instructions. When a register write is being performed, the register enable signal of the appropriate register is asserted. When a register read is being performed, then the appropriate register output is enabled and the multiplexer 80 switched to select this output.

The registers 82 are system coprocessor CP15 registers that can be used by the external debug circuitry to perform cache and MMU operations during debug. The debug status control register DSCR 28 is treated as coprocessor 14 register R1 and can be both written to and read from. The instruction transfer register ITR may only be written by the scan chain as shown in FIG. 1. The data transfer register DTR can be both written to and read from. The data transfer register is treated as coprocessor CP14 register R5.

One each of the breakpoint registers 18 and the watchpoint registers 16 are illustrated. These are associated with respective control registers 22, 20. Comparators 24, 26 are associated with these registers and serve to generate the debug event signal DE.

Figure 7:
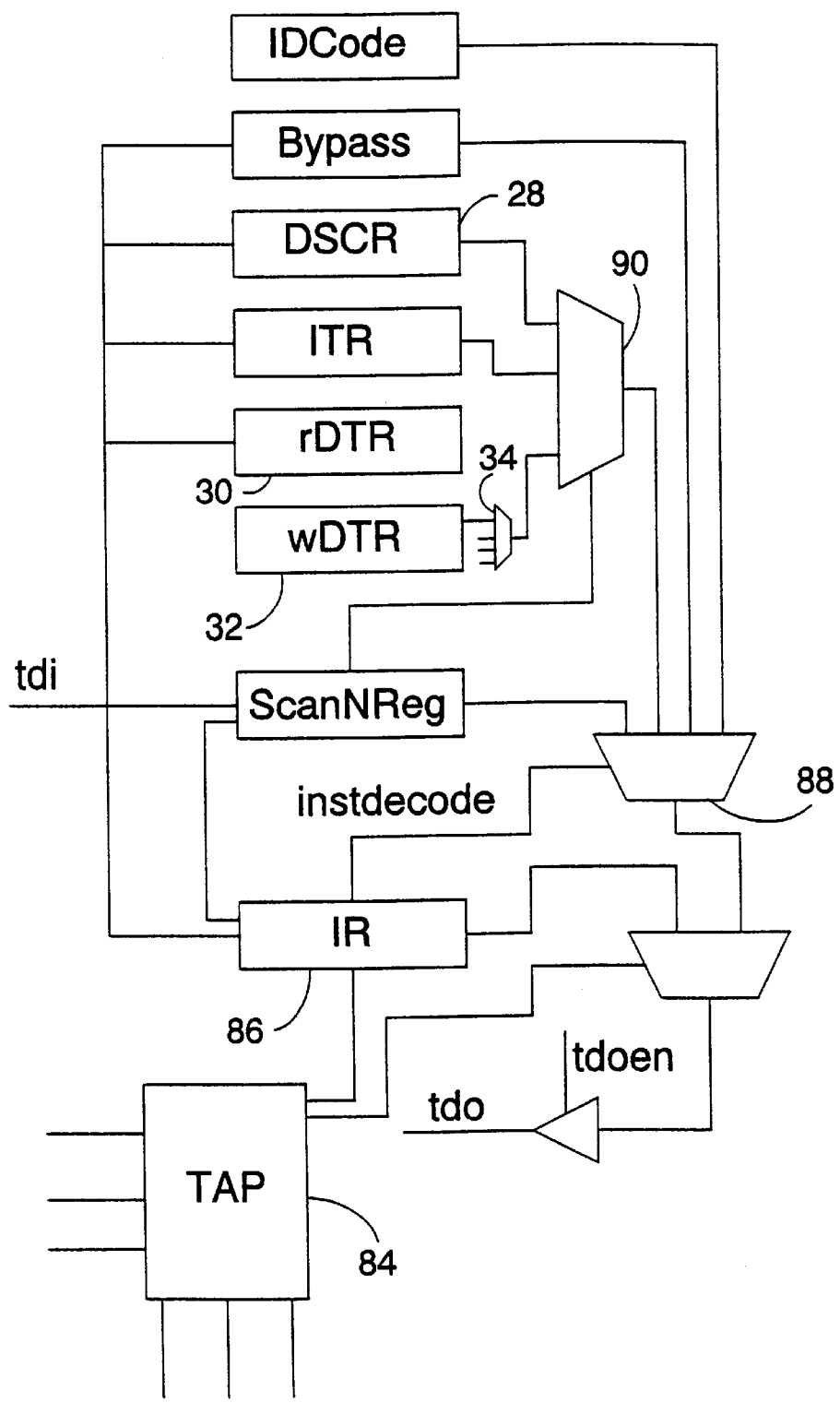
FIG. 7 illustrates a scan chain controller that is part of the debug mechanism of the data processing system of FIG. 1.

FIG. 7 schematically illustrates a portion of the scan chain system. A TAP controller 84 in accordance with usual JTAG operation is provided. The external serial data input and output are provided by the lines tdi and tdo. A JTAG instruction may be registered within instruction register IR 86. A particular scan chain can be selected using the scan chain select register 92 operating in conjunction with the multiplexers 90, 88. The two portions of the data transfer register 30, 32 together constitute a single scan chain. The instruction transfer register ITR and the debug status and control register DSCR 28 also form separate scan chains. A read only IDCode scan chain and a Bypass scan chain are also provided.

Figure 8:
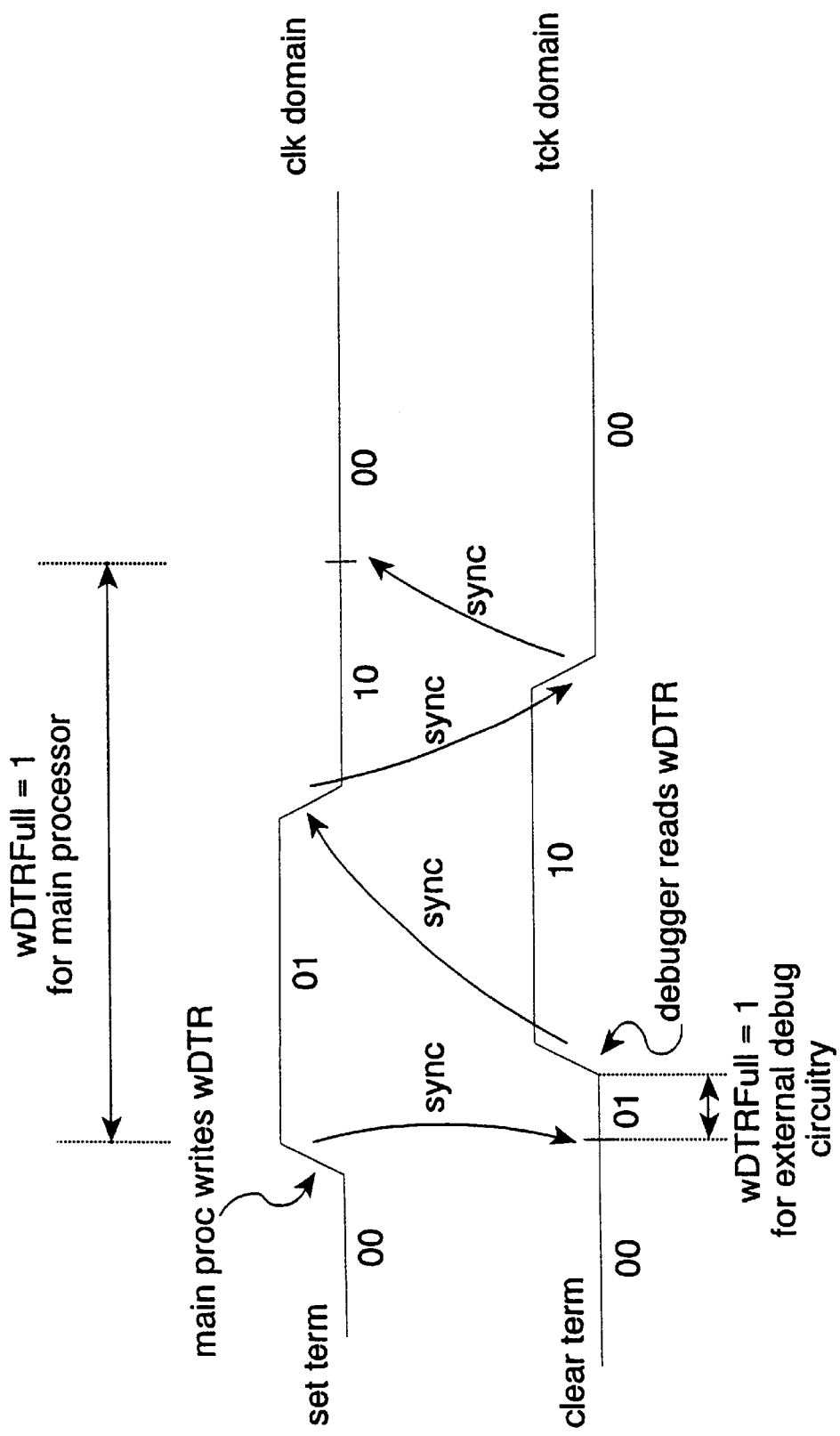
FIG. 8 illustrates the timing of part of the handshaking control of the data transfer register of FIG. 3.

FIG. 8 illustrates, by way of example, the timing of the signals passed between the scan chain controller 12 and the main processor 4 as part of the handshaking involved in control of the second register wDTR 32 that is part of the data transfer register DTR. In FIG. 8 the set term is controlled by the main processor 4 operating in the main processor clock signal domain and the clear term is controlled by the scan chain controller 12 operating in the debug clock signal domain. In more detail, the set term and the clear term are respectively controlled by their own four-state state machines (the different states of which are indicated by the two digit binary numbers in FIG. 8).

In operation the main processor 4 first writes to the wDTR register 32, moving the set term from low to high and causing wDTRFull to be asserted (the wDTRFull signal may at this point be selected as the 33rd bit of the DTR register by multiplexer 34). This particular version of the wDTRFull indicator exists only in the tck domain. The external debug circuitry is polling the 33rd bit of the DTR register watching for this transition to indicate that there is data to collect. An indicator also exists for use by the main processor 4 in its clk domain.

The debug side then reads out the wDTR register 32 and when this is finished transitions the clear term from low to high to indicate to the set term state machine that the data has been read. The transition in the clear term is passed via a synchronizer to the set term state machine which responds by transitioning the set term from high to low thereby indicating to the clear term state machine that the change in the clear term has been noted. The transition in the set term from high to low is passed by a synchronizer back to the clear term state machine that moves the clear term from high to low as the information that the wDTR register 32 has been read has been acknowledged. The transition of the clear signal from high to low is passed by a final synchronizer from the clear term state machine to the set term state machine to reset the set term state machine such that the system is ready for the main processor 4 to write another value to the wDTR register 32 if desired.

The rDTRFull indicator shown in FIG. 3 relates to the rDTR register 30 and may be created in a similar manner, with the tck and clk signals exchanged and with reads and writes exchanged.

Figure 9:
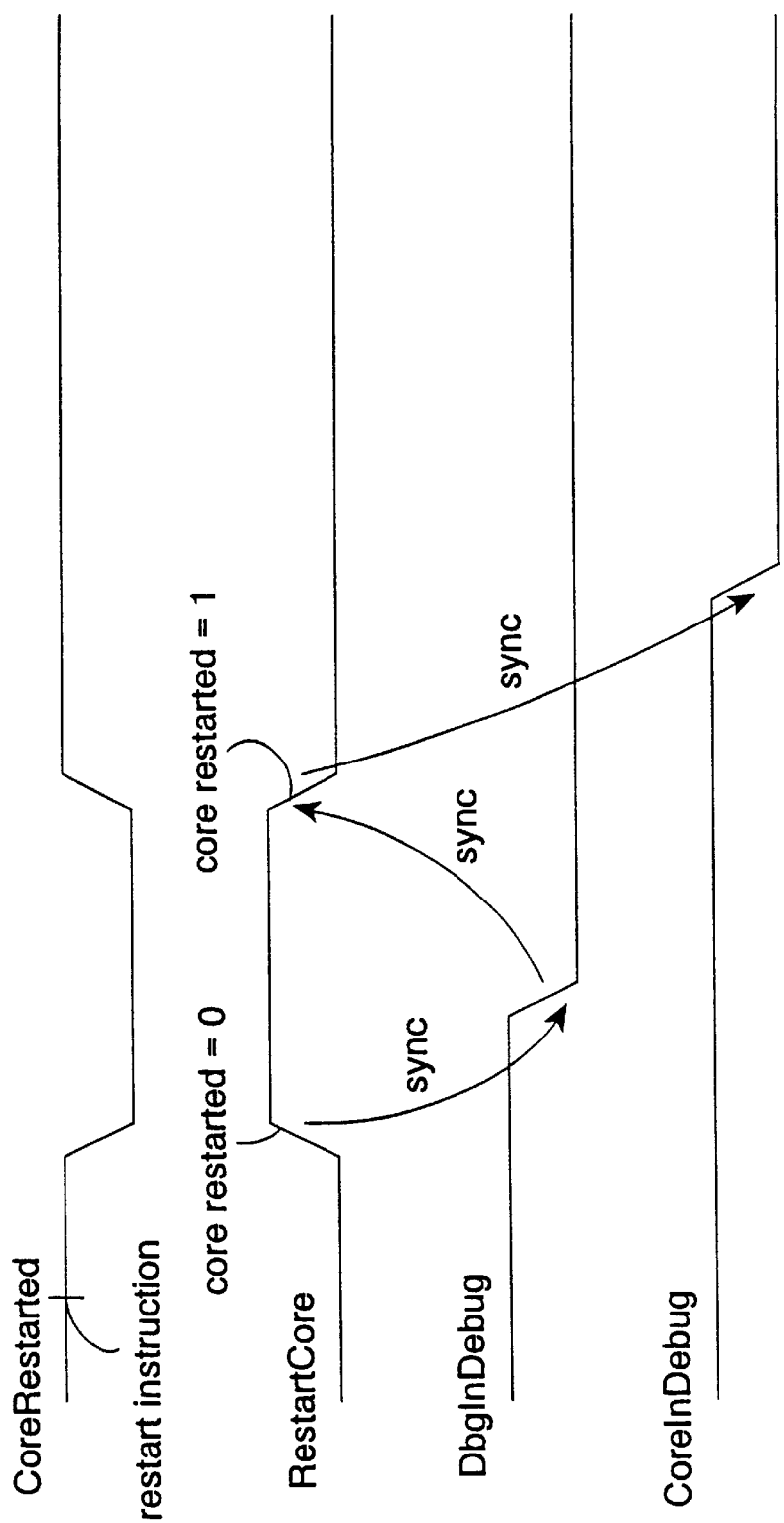
FIG. 9 illustrates the timing of handshaking signals between the debug system and the main processor that control the switching between the hardware debug mode and the normal mode.

FIG. 9 illustrates the timing of handshaking signals passed between the main processor 4 and the debug system when restarting (in response to a debug RESTART instruction) the main processor 4 from the debug state in which it has been operating as shown in FIGS. 4 and 5.

The RestartCore signal exists in the tck domain and the DbgInDebug and CoreInDebug signals exist in the clk domain. As the first step in the restarting operation, the debug control logic responds to a RESTART signal by setting a core restarted bit to 0 and moving a RestartCore signal from low to high. This transition in RestartCore is passed via a synchronizer to the main processor 4 that responds by transitioning the DbgInDebug signal from high to low. This bit in turn is passed through a synchronizer back to the debug control logic where it desserts the RestartCore signal and asserts the CoreRestarted signal. The core restarted bit must be polled by the external debug circuitry to ensure that the core has restarted. The transition in the RestartCore signal is passed via a synchronizer to the main processor 4 which responds by moving the CoreInDebug signal from high to low to transition the main processor 4 from debug state to normal state.

FIGS. 8 and 9 give two example of handshaking control signals passed between the main processor side operating in the main processor clock signal domain and the debug side operating in the debug clock signal domain. Handshaking between further control signals can be handled in a similar manner.

A further detailed view of the debug mechanisms described above is also presented in the following Microarchitecture Specification in relation to the ARM10 microprocessor and the ARM microprocessor architecture in general:

1.0 Basic Intent

1) To provide a future proof debug interface to ARM processors that will extend across many implementations
2) To provide access to hardware debug facilities from both JTAG hardware and target based software

2.0 Background

The debug logic in ARM10 provides the user with the ability to support functions similar to those found in in-circuit emulators, i.e., the ability to set up breakpoints and watchpoints, to inspect and modify the processor and system state, and to see a trace of processor activity around points of interest. Normally, software on a host computer acts as an interface to the debugger, removing the end user completely from the particular protocols that the on-chip logic requires.

ARM10 is an opportunity to clean up the debug interface presented by ARM7 and ARM9; that is to kill off unused functionality and add new functionality. Because of the complexities of ARM10 pipeline, the ARM7 and ARM9 method of jamming instructions into the pipeline has two costs: it makes ICEman software more complex, and it has hardware critical path implications that ARM10 must avoid.

There are no mask registers, chain, or range functions in ARM10. There are also no data dependent watchpoints or breakpoints. However, ARM10 does implement breakpoint instructions to replace the most common use for data dependency, which is to recognize a user-specified instruction for breakpoints in an instruction stream. We have dropped the mask registers in favor of more actual breakpoint registers.

3.0 Using ARM10 Debug

Debug on ARM10 and future machines (hereafter just called ARM10 debug) is centered around coprocessor 14 (CP14). All programming of ARM10 debug configurations is done via CP14 registers. Software executing on the target, i.e., a debug monitor or operating system debug task (hereafter called a debug task), can access debug hardware features merely by writing to a CP14 register. Register breakpoints can cause exceptions, allowing target trap handlers to take control when a register breakpoint is hit. The debug functions are accessed through both software on the target and the JTAG port. JTAG programming is performed by feeding the processor instructions one at a time, followed optionally by a burst of data, but the interface to enter, exit and perform debug steps is much cleaner and more properly defined.

3.1 Coprocessor 14
3.1.1 CP14 Interface

A coprocessor interface will act as the communication mechanism between the ARM core and the debugger, and both CP14 and CP15 accesses will be handled by this block. The coprocessor interface is similar to the VFP coprocessor interface, but has fewer control signals and narrower busses. The interface should contain the following signals:

| | description: |
|---|---|
| inputs: | |
| ASTOPCPE | indicates an ARM stall in execute |
| ASTOPCPD | indicates an ARM stall in decode |
| ACANCELCP | cancel instruction in CP |
| AFLUSHCP | flush coprocessor pipeline |
| LDCMCRDATA | bus containing input data from ARM core |
| CPINSTR[31:0] | instruction to the coprocessor from ARM |
| CPSUPER | coprocessor supervisor mode |
| CPLSLEN | length indicator to the LSU |
| CPLSSWAP | swap indicator to the LSU |
| CPINSTRV | indicates a valid instruction to the CP |

-continued

| | description: |
|---|---|
| CPRST | coprocessor reset |
| CPCLK | coprocessor clock |
| outputs: | |
| CPBUSYD | busy wait in decode |
| CPBUSYE | busy wait in execute |
| CP15SERIALIZE | force the core to hold an instruction in decode |
| CPBOUNCEE | CP rejects instruction |
| STCMRCDATA | bus containing output data to ARM core |

3.1.2 CP14 Register Map

All debug state is mapped into CP14 as registers. Three CP14 registers (R0,R1,R5) can be accessed in privileged mode by a debug task, and four registers (R0,R1,R4,R5) are accessible as scan chains. The remaining registers are only accessible in privileged mode from a debug task. Space is reserved for up to 16 breakpoints and 16 watchpoints. A particular implementation may implement any number from 2 to 16. For ARM10, there will be six (6) instruction-side breakpoints and two (2) data-side watchpoints.

The breakpoint registers will come up out of reset in privileged mode and disabled. Note that the Debug ID Register (R0) is read-only. Also, be aware that the matching bits in the watchpoint and breakpoint control registers contain an encoding which allows programmers to specify a field (e.g., a size, supervisor/user) by setting the appropriate bit. The user should set bits to all ones if the field is not being considered for matching.

There are two ways to disable debugging. A Global Enable bit in the DSCR is used to enable or disable all debug functionality via software. Upon reset, the bit is cleared, which means all debug functionality is disabled. All external debug requests are ignored by the core, and BKPT instructions are treated as no-ops. The intent of this mode is to allow an operating system to quickly enable and disable debugging on individual tasks as part of the task switching sequence. In addition, the DBGEN pin allows the debug features of the ARM10 to be disabled. This signal should be tied LOW only when debugging will not be required.

Because of the large number of registers to support, the CRm and opcode2 fields are used to encode the debug register number, where the register number is {opcode2, CRm}.

R0: Debug ID Register
DIDR[31:24] Designer code, as for CP15 R0
DIDR[23:20] Zero
DIDR[19:16] Debug Architecture Version, ARM10=0b0000
DIDR[15:12] Number of implemented register breakpoints
DIDR[11:8] Number of implemented watchpoints
DIDR[7:4] Zero
DIDR[3:0] Revision number
R1: Debug Status and Control Register (DSCR)
DSCR[1:0] Reserved
DSCR[4:2] Method of debug entry—READ ONLY

| 000 | JTAG HALT instruction occurred |
|---|---|
| 001 | Register breakpoint occurred |
| 010 | Watchpoint occurred |
| 011 | BKPT instruction occurred |
| 100 | External debug request occurred |
| 101 | Vector catch occurred |
| 110,111 | Reserved |

DSCR[5] Reserved
DSCR[6] wDTR buffer empty—READ ONLY
 This bit is set if the wDTR buffer is ready to have data written to it, normally resulting from a read of the data in the buffer by the JTAG debugger. A zero indicates that the data has not yet been read by the debugger.
DSCR[7] rDTR buffer fill—READ ONLY
 This bit is set if there is data in the rDTR for the core to read, normally resulting from the JTAG debugger writing data this buffer. A zero indicates that there is no data in the buffer to read.
D
DSCR[15:8] Reserved
DSCR[16] Vector Trap Enable—Reset
 Reset when nTRST=0 or if the TAP controller is in the Reset state.
DSCR[17] Vector Trap Enable—Undefined instruction
 Reset when nTRST=0 or if the TAP controller is in the Reset state.
DSCR[18] Vector Trap Enable—SWI
 Reset when nTRST=0 or if the TAP controller is in the Reset state.
DSCR[19] Vector Trap Enable—Prefetch Abort
 Reset when nTRST=0 or if the TAP controller is in the Reset state.
DSCR[20] Vector Trap Enable—Data Abort
 Reset when nTRST=0 or if the TAP controller is in the Reset state.
DSCR[21] Reserved
DSCR[22] Vector Trap Enable—IRQ
 Reset when nTRST=0 or if the TAP controller is in the Reset state.
DSCR[23] Vector Trap Enable—FIQ
 Reset when nTRST=0 or if the TAP controller is in the Reset state.
DSCR[30:24] Reserved
DSCR[31] Global Debug Enable—cleared on a system reset
 0=All debugging functions disabled (breakpoints, watchpoints, etc.)
 1=All debugging functions enabled.
Note: Vector catch has a higher priority than breakpoints
R2–R4: Reserved
R5: Data Transfer Register
DTR[31:0] Data
(Note: The DTR physically consists of two separate registers: the rDTR (read) and the wDTR (write). See 3.2.7 and 3.2.2.10 for the description of their use.)
R6–R63: Reserved
R64–R79: Register Breakpoint Values
BV[31:0] Register breakpoint value
R80–R95: Register Breakpoint Control Registers
BCR[0] Enable—clear on a system reset
 0=register disabled
 1=register enabled
BCR[2:1] Supervisor (Trans) Access
 00—Reserved
 10—Privileged
 01—User 11—Either
BCR[4:3] Thumb mode
  00—Reserved
  10—ARM instruction
  01—Thumb instruction
  11—Either
R96–R111: Watchpoint Values
WV[31:0] Watchpoint value
R112–R127: Watchpoint Control Registers
WCR[0] Enable
  0=register disabled (Clear on a system reset)
  1=register enabled
WCR[2:1] Supervisor (Trans)
  00—Reserved
  10—Privileged
  01—User
  11—Either
WCR[4:3] Load/Store/Either
  00—Reserved
  10—Load
  01—Store
  11—Either
WCR[7:5] Byte/Halfword/Word/Any Size
  000—Reserved
  001—Byte
  010—Halfword
  011—Byte or Halfword
  100—Word
  101—Word or Byte
  110—Word or Halfword
  111—Any Size
WCR[8] Reserved
WCR[10:9] Address Mask on Addr[1:0]
  0=include bits in comparison
  1=exclude bits in comparison
WCR[11] Reserved

3.1.3 CP14 Instructions

The following are the only legal instructions for CP14 in ARM10. LDC and STC instructions are valid only for the DTR register. All other instructions will bounce.

| Register | Name | Instruction | |
|---|---|---|---|
| R0 | ID | MRC | p14.0,Rd,c0,c0,0 |
| R1 | DCSR | MRC | p14.0,Rd,c0,c1,0 |
|  |  | MRC | p14.0,Rd,c0,c1,0 |
| R5 | DTR | MRC | p14.0,Rd,c0,c5,0 |
|  |  | MRC | p14.0,Rd,c0,c5,0 |
|  |  | LDC | p14.c5,<addressing mode> |
|  |  | STC | p14.c5,<addressing mode> |

| Register | Name | Instruction | |
|---|---|---|---|
| R64 BV | | MRC | p14,0,Rd,c0,c0,4 |
|  | | MCR | p14,0,Rd,c0,c0,4 |
| R65 BV | | MRC | p14,0,Rd,c0,c1,4 |
|  | | MCR | p14,0,Rd,c0,c1,4 |
| R66 BV | | MRC | p14,0,Rd,c0,c2,4 |
|  | | MCR | p14,0,Rd,c0,c2,4 |

-continued

| Register | Name | Instruction |
|---|---|---|
| R67 BV | MRC | p14,0,Rd,c0,c3,4 |
|  | MCR | p14,0,Rd,c0,c3,4 |
| R68 BV | MRC | p14,0,Rd,c0,c4,4 |
|  | MCR | p14,0,Rd,c0,c4,4 |
| R69 BV | MRC | p14,0,Rd,c0,c5,4 |
|  | MCR | p14,0,Rd,c0,c5,4 |
| R80 BCR | MRC | p14,0,Rd,c0,c0,5 |
|  | MCR | p14,0,Rd,c0,c0,5 |
| R81 BCR | MRC | p14,0,Rd,c0,c1,5 |
|  | MCR | p14,0,Rd,c0,c1,5 |
| R82 BCR | MRC | p14,0,Rd,c0,c2,5 |
|  | MCR | p14,0,Rd,c0,c2,5 |
| R83 BCR | MRC | p14,0,Rd,c0,c3,5 |
|  | MCR | p14,0,Rd,c0,c3,5 |
| R84 BCR | MRC | p14,0,Rd,c0,c4,5 |
|  | MCR | p14,0,Rd,c0,c4,5 |
| R85 BCR | MRC | p14,0,Rd,c0,c5,5 |
|  | MCR | p14,0,Rd,c0,c5,5 |
| R96 WV | MRC | p14,0,Rd,c0,c0,6 |
|  | MCR | p14,0,Rd,c0,c0,6 |
| R97 WV | MRC | p14,0,Rd,c0,c1,6 |
|  | MCR | p14,0,Rd,c0,c1,6 |
| R112 WCR | MRC | p14,0,Rd,c0,c0,7 |
|  | MCR | p14,0,Rd,c0,c0,7 |
| R113 WCR | MRC | p14,0,Rd,c0,c1,7 |
|  | MCR | p14,0,Rd,c0,c1,7 |

3.2 The Hardware Interface to Debug

3.2.1 Entering and Exiting Halt Mode

Halt mode is enabled by writing a 1 to bit 30 of the DSCR, which can only be done by the JTAG debugger. When this mode is enabled, the processor will halt (as opposed to taking an exception in software) if one of the following events occurs:

a) EDBGRQ is asserted b) A HALT instruction has been scanned in through the JTAG interface. The TAP controller must pass through Run-Test/Idle in order to issue the HALT command to the core.

c) An exception occurs and the corresponding vector trap enable bit is set d) A register breakpoint hits e) A watchpoint hits f) A BKPT instruction reaches the execute stage of the ARM pipeline The Core Halted bit in the DSCR is set when debug state is entered. Presumably, the debugger will poll the DSCR by going through Capture-DR and Shift-DR until it sees this bit go high. At this point, the debugger determines why the core was halted and preserves the machine state. The MSR instruction can be used to change modes and gain access to all banked registers in the machine. While in debug state, the PC is not incremented, external interrupts are ignored, and all instructions are read from the Instruction Transfer Register (scan chain 4).

Exiting from debug state is performed by scanning in the RESTART instruction through the JTAG interface. The debugger will adjust the PC before restarting, depending on the manner in which the core entered debug state. The table below indicates the value of the PC at the time the core halted for each case.

|  | ARM | Thumb |
| --- | --- | --- |
| EDBGRQ asserted | PC + 8 | PC + 4 |
| HALT instruction | PC + 8 | PC + 4 |
| Vector Trap | PC + 8 | PC + 4 |
| Register Breakpoint | PC + 8 | PC + 4 |
| Instruction Breakpoint | PC + 8 | PC + 4 |
| Watchpoint | PC + 8 | PC + 4 |

When the state machine enters the Run-Test/Idle state, normal operations will resume. The delay, waiting until the state machine is in Run-Test/Idle, allows conditions to be set up in other devices in a multiprocessor system without taking immediate effect. When Run-Test/Idle state is entered, all the processors resume operation simultaneously. The Core Restarted bit will be set when the RESTART sequence is complete.

Note that before the core issues a RESTART command, it should poll the "Instruction Complete" bit (wDTR[0]) to ensure that the last instruction completes without any problems (potential aborts and whatnot). After issuing a RESTART instruction to the core, the debugger must poll to see that the core has indeed restarted before doing anything else. There are synchronizers and handshake lines in the debug logic which must have a clock (specifically, TCK) to allow the clearing of those handshake lines. If the clock is turned off before the debug logic has a chance to clear down the DbgRestart line, then the core will remain in debug state and not start up again. The very act of reading the Core Restarted bit gives enough clocks to clear down the necessary lines.

3.2.2 The JTAG Port and Test Data Registers

The JTAG portion of the logic will implement the IEEE 1149.1 interface and support a Device ID Register, a Bypass Register, and a 4-bit Instruction Register. In addition, the following public instructions will be supported:

| Instruction | Binary Code |
| --- | --- |
| EXTEST | 0000 |
| SCAN_N | 0010 |
| SAMPLE/PRELOAD | 0011 |
| CLAMP | 0101 |
| HIGHZ | 0111 |
| CLAMPZ | 1001 |
| IDCODE | 1110 |
| BYPASS | 1111 |
| INTEST | 1100 |
| RESTART | 0100 |
| HALT | 1000 |

Access to the debug registers can be obtained through either software (with MCR instructions) or through the JTAG port. Fundamentally the hardware debug mechanism is similar to ARM7/ARM9, but ARM10 debug hides all clocking and pipeline depth issues from the debugger.

Registers in CP14 which are accessible via JTAG (R1,R5) are written using an EXTEST instruction. The registers R0, R1, and R5 are read with either the INTEST or EXTEST instruction. This differs from ARM9 in that only the INTEST instruction was used and a r/w bit in the chain determined the operation to be performed.

3.2.2.1 Bypass Register

Purpose: Bypasses the device during scan testing by providing a path between TDI and TDO.

Length: 1 bit

Operating mode: When the bypass instruction is the current instruction in the instruction register, serial data is transferred from TDI to TDO in the Shift-DR state with a delay of one TCK cycle. There is no parallel output from the bypass register. A logic 0 is loaded from the parallel input of the bypass register in Capture-DR state.

Order: TDI-[0]-TDO 3.2.2.2 Device ID Code Register

Purpose: In order to distinguish the ARM10 from ARM7T and ARM9T, the TAP controller ID will be unique so that Multi-ICE can easily see to which processor it's connected. This ID register will be routed to the edge of the chip so that partners can create their own ID numbers by tying the pins to high or low values. The generic ID for ARM10200 will initially be 0x01020F0F. All partner-specific devices will be identified by the ID numbers of the following form:

| Version LSB | Part Number | Manufacturer ID |  |
| --- | --- | --- | --- |
| [31:28] | [27:12] | [11:1] | 1 |

Length: 32 bits

Operating mode: When the IDCODE instruction is current, the ID register is selected as the serial path between TDI and TDO. There is no parallel output from the ID register. The 32-bit ID code is loaded into the register from its parallel inputs during the Capture-DR state.

Order: TDI-[31][30]. . . [1][0]-TDO 3.2.2.3 Instruction Register

Purpose: Changes the current TAP instruction

Length: 4 bits

Operating mode: When in Shift-DR state, the instruction register is selected as the serial path between TDI and TDO. During the Capture-DR state, the value 0001 binary is loaded into this register. This is shifted out during Shift-IR (least significant bit first), while a new instruction is shifted in (least significant bit first). During the Update-IR state, the value in the instruction register becomes the current instruction. On reset, the IDCODE becomes the current instruction.

Order: TDI-[3][2][1][0]-TDO 3.2.2.4 Scan Chain Select Register

Purpose: Changes the current active scan chain

Length: 5 bits

Operating mode: After SCAN_N has been selected as the current instruction, when in Shift-DR state, the Scan Chain Select register is selected as the serial path between TDI and TDO. During the Capture-DR state, the value 10000 binary is loaded into this register. This is shifted out during Shift-DR (least significant bit first), while a new value is shifted in (least significant bit first). During the Update-DR state, the value in the register selects a scan chain to become the currently active scan chain. All further instructions such as INTEST then apply to that scan chain. The currently selected scan chain only changes when a SCAN_N instruction is executed, or a reset occurs. On reset, scan chain 3 is selected as the active scan chain. The number of the currently selected scan chain is reflected on the SCREG[4:0] output bus. The TAP controller may be used to drive external scan chains in addition to those within the ARM1020 macrocell. The external scan chain must be assigned a number and control signals for it, and can be derived from SCREG[4:0], IR[3:0], TAPSM[3:0], and TCK.

Order: TDI-[4][3][2][1][0]-TDO
3.2.2.5 Scan Chain 0
Purpose: Debug
Length 32 bits
This scan chain is CP14 Register 0, the Debug ID Register.
Order: TDI-[31][30] . . . [1][0]-TDO
3.2.2.6 Scan Chain 1
Purpose: Debug
Length: 32 bits
This scan Chain is CP14 Register 1, the DSCR. Note that bits DSCR[15:0] are read only. The following bits are defined for Chain 1:
DSCR[0] Core Halted—READ ONLY
DSCR[1] Core Restarted—READ ONLY
DSCR[4:2] Method of debug entry—READ ONLY

| | |
|---|---|
| 000 | JTAG HALT instruction occurred |
| 001 | Register breakpoint occurred |
| 010 | Watchpoint occurred |
| 011 | BKPT instruction occurred |
| 100 | External debug request occurred |
| 101 | Vector catch occurred |
| 110,111 | Reserved |

DSCR[5] Abort occurred sometime in the past—WRITABLE ONLY WITH AN MCR
This bit is sticky; it's cleared with an MCR to the DSCR where this bit is a zero.
Reset when nTRST=0 or if the TAP controller is in the Reset state.
DSCR[6] wDTR buffer empty—READ ONLY
This bit is the core's indicator that the wDTR buffer is empty, meaning that the core can write more data into it. This is the inversion of the bit that the JTAG debugger would see if were to poll the DTR by going through CaptureDR with EXTEST. The debugger should not use this bit to determine if the wDTR is empty or full as the timing between the JTAG signal and the core signal are different.
DSCR[7] rDTR buffer full—READ ONLY
This bit is the core's indicator that the rDTR buffer is full, meaning that the debugger has written data into it. This is the inversion of the bit that the JTAG debugger would see if were to poll the DTR by going through CaptureDR with INTEST. The debugger should not use this bit to determine if the rDTR is empty or full as the timing between the JTAG signal and the core signal are different.
DSCR[15:8] Reserved
DSCR[16] Vector Trap Enable—Reset—READ ONLY
Reset when nTRST=0 or if the TAP controller is in the Reset state.
DSCR[17] Vector Trap Enable—Undefined Instruction—READ ONLY
Reset when nTRST=0 or if the TAP controller is in the Reset state.
DSCR[18] Vector Trap Enable—SWI—READ ONLY
Reset when nTRST=0 or if the TAP controller is in the Reset state.
DSCR[19] Vector Trap Enable—Prefetch Abort—READ ONLY
Reset when nTRST=0 or if the TAP controller is in the Reset state.
DSCR[20] Vector Trap Enable—Data Abort—READ ONLY
Reset when nTRST=0 or if the TAP controller is in the Reset state.
DSCR[21] Vector Trap Enable—Reserved
DSCR[22] Vector Trap Enable—IRQ—READ ONLY
Reset when nTRST=0 or if the TAP controller is in the Reset state.
DSCR[23] Vector Trap Enable—FIQ—READ ONLY
Reset when nTRST=0 or if the TAP controller is in the Reset state.
DSCR[26:24] Reserved
DSCR[27] Comms Channel Mode
0=No comms channel activity
1=Comms channel activity
Reset when nTRST=0 or if the TAP controller is in the Reset state.
DSCR[28] Thumb mode indicator (see Section 5.0)
DSCR[29] Execute Instruction in ITR select
0=Disabled
1=Instruction in ITR is sent to prefetch unit if JTAG state machine passes through Run-Test/Idle
Set when nTRST=0 or if the TAP controller is in the Reset state.
DSCR[30] Halt/Monitor mode select
0=Monitor mode enabled
1=Halt mode enabled.
Reset when nTRST=0 or if the TAP controller is in the Reset state.
DSCR[31] Global Debug Enable—cleared on a system reset
0=All debugging functions disabled (breakpoints, watchpoints, etc.)
1=All debugging functions enabled.
Reset when nRESET=0 (the core's reset line)
Note that the comms channel bits, rDTR Full and wDTR Empty are inversions of what the debugger sees, as these bits are mirrored in the DSCR for the core's use, not the debugger's.
Order: TDI-[31][30] . . . [1][0]-TDO
3.2.2.7 Scan Chain 2
Purpose: Debug
Length: 65 bits
This scan chain is the combination of CP14 Registers 4 and 5. Note that the Instruction Complete bit in Register 4 is not included in this chain. It only appears in chain 4.
Order: TDI-Reg4[32]Reg4[31] . . . Reg4[1]Reg5[32]Reg5[31] . . . Reg5OTDO
3.2.2.8 Scan Chain 3
Purpose: Can be used for external boundary scan testing. Used for inter-device testing (EXTEST) and testing the core (INTEST).
Length: undetermined
3.2.2.9 Scan Chain 4
Purpose: Debug
Length: 33 bits
This scan chain is the Instruction Transfer Register, used to send instructions to the core via the prefetch unit. This chain consists of 32 bits of information, plus an additional bit to indicate the completion of the instruction sent to the core.
Order: TDI-[32][31][30] . . . [1][0]-TDO
3.2.2.10 Scan Chain 5
Purpose: Debug
Length: 33 bits
This scan chain is CP14 Register 5, the Data Transfer Register. This register physically consists of two separate registers: the read-only DTR (rDTR) and the write-only DTR (wDTR). This register has been separated to facilitate the creation of a bidirectional comms channel in software. The rDTR can only be loaded via the JTAG port and read only by the core via an MRC instruction. The wDTR can only be loaded by the core through an MCR instruction and read only via the JTAG port. From the TAP controller's perspective, it only sees one register (Chain 5), but the appropriate register is chosen depending on which instruction is used (INTEST or EXTEST).

The wDTR chain itself contains 32 bits of information plus one additional bit for the comms channel. The definition of bit 0 depends on whether the current JTAG instruction is INTEST or EXTEST. If the current instruction is EXTEST, the debugger can write to the rDTR, and bit 0 will indicate if there is still valid data in the queue. If the bit is clear, the debugger can write new data. When the core performs a read of the DTR, bit 0 is automatically cleared. Conversely, if the JTAG instruction is INTEST, bit 0 indicates if there is currently valid data to read in the wDTR. If the bit is set, JTAG should read the contents of the wDTR, which in turn, clears the bit. The core can then sample bit 0 and write new data once the bit is clear again.

The rDTR chain contains 32 bits of information plus one additional bits for the comms channel.

Order: TDI-rDTR[32]rDTR[31] . . . rDTR[1]rDTR[0] wDTR[32]wDTR[31] . . . wDTR[1]wDTR[0]-TDO 3.2.2.11 Scan Chains 6–15

Reserved 3.2.2.12 Scan Chains 16–31

Unassigned 3.2.3 Sending Instructions to the Core

Two registers in CP14 are used to communicate with the ARM10 processor, the Instruction Transfer Register (ITR) and the Data Transfer Register (DTR). The ITR is used to jam an instruction into the processor's pipeline. While in debug state, most of the processor's time is spent effectively executing invalid instructions until the ITR is ready. In hardware debug state, the PC is not incremented as instructions are executed; however, branches will still modify the PC.

DSCR[29] controls an autoexecute function. When this bit is set, each time the JTAG TAP controller enters the Run-Test/Idle state, the instruction currently residing in the ITR is sent to the prefetch unit for execution by the core. If this bit is clear, no instruction will be passed to the prefetch unit. The instruction in the JTAG IR register must be either INTEST or EXTEST.

The autoexecute feature allows for fast uploads and downloads of data. For example, a download sequence might consist of the following. Initially, scan chain 2, the combination of scan chains 4 and 5, is selected in the ScanNReg, then the JTAG instruction is set to EXTEST for writing. A core write instruction (an STC) and the associated data are serially scanned into the ITR and DTR, respectively. When the TAP controller passes through the Run-Test/Idle state, the instruction in the ITR is issued to the core. Next, the scan chain can be switched to the DTR only (chain 5) and polled by going through the Capture-DR state, then the Shift-DR state. The least significant bit in the chain, which is bit wDTR[0], is examined until this status bit indicates the completion of the instruction. More data can then be loaded into DTR and the instruction re-executed by passing through Run-Test/Idle. Here, we also assume that the STC instruction specifies base address writeback so that the addresses are automatically updated.

To increase the performance of upload, a similar mechanism can be used. First, the JTAG instruction is changed to EXTEST. Using chain 2, a read instruction such as LDC can be scanned into the ITR. Then, the JTAG instruction is switched to INTEST for reading. The scan chain can then be switched to the DTR and polled until the instruction completes. By passing through the Run-Test/Idle state on the way to Shift-DR (for polling), the instruction in the ITR is issued to the core. This process is then repeated until the last word is read.

Having the instruction executed by going through Run-Test/Idle addresses the problem of running the core clock at a frequency close to that of the JTAG clock. If the instruction has been issued to the core and the data is not yet available for capture, the emulator can simply go around the state machine loop again and poll until the data is available. Once there, it can swing around the state machine loop once more and capture the data, then scan it out. Placing the autoexecute mechanism on any other state in the inner loop forces another instruction to be dispatched too early, possibly overwriting other data. Run-Test/Idle sits outside the inner loop and is only one state transition away, incurring little penalty for having to go through it. For systems where the processor clock is significantly faster than the JTAG clock, the data will normally be available well before the TAP controller gets to Capture-DR from Run-Test/Idle, so it will pass through the inner loop one time, capturing the data then scanning it out.

Note that because CP14 does not monitor the busses in the same manner that ARM9 did, reading the contents of the core's register file requires individual moves from an ARM register to CP14 Register 5 instead of using LDM/STM instructions. The information can then be scanned out of the DTR.

Byte and Halfword transfers are performed by transferring both the address and data into the processor and then executing the appropriate ARM instructions.

Transfers to and from coprocessors can be performed by moving data via an ARM register. This implies that all ARM10 coprocessors should have all data accessible via MRC and MCR (otherwise a data buffer in writeable memory must be used).

3.2.4 Reading and Writing Breakpoint and Watchpoint Registers

Hardware breakpoints and watchpoints are written by transferring the data to an ARM register and then moving the data to the appropriate breakpoint or watchpoint register. As an example, consider loading breakpoint register R64:

Scan into ITR: MRC p14,0,Rd,c0,c3,0

Scan into DTR: Data to be loaded into Breakpoint Register R64 Command is executed Scan into ITR: MCR p14,0,Rd,c0,c0,4

In the above example, the first MRC instruction moves data from the DTR register (R5 in CP14) to another register in ARM. Once this data is moved, an MCR instruction transfers the data from the ARM register into the breakpoint register (R64 in CP14).

The opposite process can be used to read a breakpoint register. The breakpoint and watchpoint registers are not directly accessible from a scan chain to minimize the implementation cost.

The Instruction Address that gets issued by the prefetch unit always has bit 0 set to zero. In Thumb mode, bit 1 represents the odd wordiness of an address, while in ARM mode, this bit is also set to zero. Although breakpoint registers contain a fill 32-bit field for comparison, for breakpoints and watchpoints in Thumb mode, the user should take care not to set a value in the register which would never match, i.e., bit 0 is a one.

The bits in a breakpoint and watchpoint control register should be self-explanatory.

3.2.5 Software Lockout Function

When the JTAG debugger is attached to an evaluation board or test system, it will indicate its presence by setting the Halt/Monitor Mode bit in the DSCR. At this point, breakpoint and watchpoint registers can be written and read by the debugger while in Halt Mode. Once breakpoint and watchpoint registers have been configured, software cannot alter them from the processor side if the Halt/Monitor Mode bit remains high as the debugger retains control. The core can still write to the comms channel register, however.

3.2.6 External Signals

There is one external signal associated with debug: EDBGRQ, with which the system requests the ARM1020 to enter debug state. External logic may wish to use this line to halt the ARM1020 in a multiprocessor system or at startup to immediately force the processor into debug state.

3.2.7 Saving and Restoring Processor State

Before debugging, the emulator must save control settings, register values, or other state that might get altered during the course of emulation. To this end, care needs to be taken to restore all conditions back to their original state before leaving debug. The PC value that is read out after debug entry will be PC+0x8 for all cases, i.e., vector catches, BKPT instructions, register breakpoints, HALT instructions from JTAG, etc.

Because the DTR has been split into two registers, it's necessary to save the rDTR and wDTR state information. A save and restore sequence might look like:
(hardware executes a HALT instruction through JTAG)
Poll until Core Halted is asserted
Once asserted, capture the wDTR and scan it out
Change the JTAG IR to EXTEST and scan junk into the rDTR—this forces the rDTR status bit out
(save other registers)
(finished debugging)
Scan the old CPSR into the rDTR
Load the ITR with an MRC which transfers the rDTR into R0 and execute
Load the ITR with an MSR which transfers R0 to CPSR
Scan the old PC into rDTR
Load the ITR with an MRC which transfers the rDTR into R0 and execute
Load the ITR with a MOV which transfers R0 into the PC
Scan the old R0 into the rDTR
Load the ITR with an MRC which transfers the rDTR into R0
(restore registers)
If the saved rDTR status bit indicated it was full, scan old rDTR information into the rDTR
Issue RESTART command
Poll until Core Restarted is asserted.

3.3 The Software Interface to Debug

Monitor mode describes those ARM operations that are used to configure register breakpoints, respond to those breakpoints, and even halt the core. Monitor mode is also useful in real-time systems when the core cannot be halted in order to collect information. Examples are engine controllers and servo mechanisms in hard drive controllers that cannot stop the code without physically damaging the components. For situations that can tolerate a small intrusion into the instruction stream, monitor mode is ideal. Using this technique, code can be suspended with an interrupt long enough to save off state information and important variables. The code continues once the exception handler is finished.

3.3.1 Entering and Exiting Monitor Mode

Monitor mode is enabled by writing a 0 to bit 30 of the DSCR. When monitor mode is enabled, the processor takes an exception (rather than halting) if one of the following events occurs:
1) A register breakpoint is hit
2) A watchpoint is hit
3) A breakpoint instruction reaches the execute stage of the ARM pipeline
4) An exception is taken and the corresponding vector trap bit is set Note that the Global Debug Enable bit in the DSCR must be set or no action is taken. Exiting the exception handler should be done in the normal fashion, e.g., restoring the PC to (R14–0x4) for prefetch exceptions, moving R14 into the PC for BKPT instructions because they're skipped, etc. The table below indicates the value of the PC at the time the core takes the exception.

|  | ARM | Thumb |
| --- | --- | --- |
| Vector Trap | PC + 8 | PC + 4 |
| Register Breakpoint | PC + 8 | PC + 4 |
| Instruction Breakpoint | PC + 8 | PC + 4 |
| Watchpoint | PC + 8 | PC + 8 |
| Data Abort | PC + 8 | PC + 8 |

3.3.2 Reading and Writing Breakpoint and Watchpoint Registers

When in monitor mode, all breakpoint and watchpoint registers can be read and written with MRC and MCR instructions from a privileged processing mode.

For a description of the register field encodings, see Sections and 3.1.2 and 3.2.4.

3.3.3 The BKPT Instruction

The ARM debug architecture defines breakpoint instructions for both ARM and Thumb. Execution of one of these instructions has the same effect as hitting a register breakpoint. In monitor mode, a prefetch abort is taken; in halt mode, the core halts. Each debug instruction has an unused field, 8 bits for Thumb and 12 bits for ARM, that can be used by the debugger to identify individual breakpoints.

The ARM opcode is 32'hE12xxx7x; the Thumb opcode is 16'hbexx, where x designates an unused field.

3.3.4 The Comms Channel

The comms channel in ARM10 has been implemented by using the two physically separate Data Transfer Registers (DTRs) and a bit to augment each register, creating a bidirectional serial port. The extra bit indicates that valid data resides in the data register. By convention, the target software owns the write DTR (WDTR) and the host software owns the read DTR (rDTR). In other words, the wDTR is written by the core and the information is then scanned out through the JTAG port by the host. Since the wDTR is the only register with a TDO connection, bit 0 of scan chain 5 is chosen by the current instruction (either INTEST or EXTEST) in the JTAG Instruction Register. When doing debug comms channel activities, bit 27 of the DSCR is set to indicate to the debug logic that the least significant bit of the wDTR now indicates the state of the comms channel registers rather than the completion of instructions.

When the debugger is reading the data meant for it, INTEST is loaded into the IR and the contents of the wDTR are scanned out. If the least significant bit of the 33-bit packet of data is set, the data is valid. Bit 0 in the wDTR is then cleared by this read. If the bit is cleared, meaning that the core has not written any new data, the debugger may wish to poll the DSCR to see if the core has halted.

Similarly, EXTEST is used to write data into the rDTR by the debugger, and this operation sets bit 0 for this register, indicating valid data. What the debugger sees is actually the inversion of this bit, so when the debugger goes to write more data, bit 0 should be checked to see that it set, meaning the core has read the rDTR. If the bit was a zero, indicating that the rDTR is still full and the core has not read old data, then the new data shifted in is not loaded into the rDTR. If after doing this many times, the debugger wants to check if the core has halted, the status bit remains valid, as well as the data in the rDTR. This must be scanned out and replaced once the debugger saves off state information, only to be scanned back in at a later time. This act of moving the data from the rDTR into a core register then into the wDTR to be scanned out will clear down the state machines which control the rDTRfull bit.

These extra bits are actually reflected in the DSCR, so that the core can use MRCs to read them. Note, however, that the bits are inversions of those seen by the debugger, since they are for the core's use.

Because halt mode and monitor mode are mutually exclusive, the transfer registers are not used for any other purpose in monitor mode.

4.0 Debug and Exceptions, Vector Catching

4.1 Instruction Breakpoints

Instruction breakpoints will be clocked into the core at the same time as instruction data. The breakpoint will be taken as soon as the instruction enters the execute stage of the pipeline, assuming an abort is not pending. The breakpoint is taken whether or not the instruction would have failed its condition code.

A breakpointed instruction may have a prefetch abort associated with it. If so, the prefetch abort takes priority and the breakpoint is ignored. SWI and undefined instructions are treated in the same way as any other instruction which may have a breakpoint set on it. Therefore, the breakpoint takes priority over the SWI or undefined instruction.

On an instruction boundary, if there is a breakpointed instruction and an interrupt (FIQ or IRQ), the interrupt is taken and the breakpointed instruction is discarded. Once the interrupt has been serviced, the execution flow is returned to the original program. This means that the instruction which was previously breakpointed is fetched again, and if the breakpoint is still set, the processor enters debug state once it reaches the execute stage of the pipeline.

4.2 Watchpoints

Entry into debug state following a watchpointed memory access is imprecise relative to the instruction stream accesses. This is due to the nature of the pipeline and the timing of the watchpoint signals going to the core. The processor will stop on the next instruction executed after the watchpoint triggers, which may be several instructions after the watchpointed instruction began execution.

If there is an abort with the data access as well as a watchpoint, the abort exception entry sequence is performed, and then the processor enters debug state. If there is an interrupt pending, again the processor allows the exception entry sequence to occur and then enters debug state. If the following instruction aborts, then the abort will be not be taken.

The Fault Status Register (FSR) in CP15 differentiates between the MMU and the debug system aborting an access. Bit 9 of the FSR[3:0] field is forced to a zero if a data abort occurs. If there is no data abort and a watchpoint occurs, DFSR[9] is forced to a one. When software reads this register and sees DFSR[9] set to a one, the remaining bits should be ignored.

4.3 Interrupts

Once the processor has entered debug state, it is important that further interrupts do not affect the instructions executed. For this reason, as soon as the processor enters debug state, interrupts are disabled, although the state of the I and F bits in the PSR are not affected.

4.4 Exceptions

The order of exception priorities in the ARM10 core is as follows:

| | |
|---|---|
| Highest | Reset |
| | Vector Trap* |
| | Data Abort |
| | Watchpoint |
| | CP Bounce |
| | FIQ |
| | IRQ |
| | JTAG HALT |
| | External Debug Request |
| | Prefetch Abort |
| | Register Breakpoint hit |
| | Instruction Breakpoint hit |
| Lowest | SWI/Undefined |

*Vector traps can only be taken at the end of another exception. Once an exception entry sequence has completed, the trap for that sequence will be taken in preference over all following exceptions, except for Reset.

The table below summarizes the behavior of the debug logic in both halt and monitor modes.

| Event | Halt Mode DbgGlobalEn x | Monitor Mode DbgGlobalEn 0 | DbgGlobalEn 1 | MOE[2:0] |
|---|---|---|---|---|
| Data Abort | Data abort | Data abort | Data abort | 000 |
| Register breakpoint | Halt | X | Prefetch abort | 001 |
| Watchpoint | Halt | X | Data abort | 010 |
| BKPT instruction | Halt | X | Prefetch abort | 011 |
| JTAG HALT | Halt | X | X | 111 |
| EDBGRQ | Halt | X | X | 100 |
| Prefetch Abort | Prefetch abort | Prefetch abort | Prefetch abort | 000 |
| Vector trap | Halt | X | X | 101 |

In monitor mode, if a register breakpoint is hit or the BKPT instruction is executed, the prefetch abort exception is taken. If a watchpoint hits, the data abort exception is taken. The Fault Status Register (FSR) in CP15 is used to differentiate between the MM and the debug system aborting the access. An encoding has been added to the FSR to indicate that a watchpoint hit. R14_abort points to the first instruction after the one which has not been executed. The two pathological cases have been disabled: setting a vector trap on a prefetch abort or a data abort is not allowed. Under no circumstances should a JTAG HALT instruction be scanned into the part while in software mode, as the handshake line that the debug logic uses to clear down the DbgHalt line—the DbgInDebug line—never appears and would cause the processor to continually take prefetch aborts (under the current Rev 0 hardware implementation). For the case of load or store multiple instructions which have watchpoints set, other instructions could have possibly (and probably) run underneath it. Since the debugger will have to know the return PC value as well as the PC value of the load/store multiple instruction, the data address of the watchpoint will be stored in the D-side Fault Address Register (FAR), the PC of the watchpoint instruction itself (plus 0x8) will be stored in I-side FAR. The restart PC will be held in the R14 as usual.

If the undefined instruction exception is taken while the core is in debug state, i.e., if a debugger scans an undefined instruction into the core while in debug state, the core will change modes and change the PC to the undefined instruction trap vector. The debugger can use this information to determine when an undefined instruction has been seen by the core. An example might be a coprocessor instruction which bounces because it's not supported for a given implementation.

4.5 Vector Catching

The ARM10 debug unit contains logic that allows efficient trapping of fetches from the vectors during exceptions. This is controlled by the Vector Catch Enables located in the DSCR. If one of the bits in this register field is set HIGH and the corresponding exception occurs, the processor behaves as if a register breakpoint has been set on an instruction fetch from the relevant exception vector, then halts. The vector trap enables are writeable only from JTAG.

For example, if the processor is in halt mode and executes a SWI instruction while DSCR[18] is set, the ARM10 fetches an instruction from 0x8. The vector catch hardware detects this access and sets an internal breakpoint signal, forcing the core to stop.

The vector catch logic is sensitive only to fetches from the vectors during exception entry. Therefore, if the code branches to an address within the vectors during normal operation, and the corresponding vector catch enable bit is set, the processor is not forced into debug state. A register breakpoint can be used to catch any instruction fetch from a vector.

The state priority of interrupts over breakpoints was the cause of a vector catching bug in the ARM9. For ARM10, if an interrupt request occurs during the issue of an instruction fetched from an exception vector which has been vector caught, then the core will handle the vector trap first. Once the core is restarted, the processor will then handle the interrupt request.

5.0 Thumb

In debug state, the T bit in the CPSR is read/writeable by the debugger, and it does not get altered when entering or exiting debug state. Also, it does not affect the type of instruction executed while in debug state. When leaving debug state, the CPSR T bit determines whether ARM or Thumb instructions will be executed.

The T bit in the DSCR indicates the type of instruction (either ARM or Thumb) the debugger is about to execute and can be used to force the processor into ARM mode or Thumb mode once the core is halted, as it will be sent along with each instruction sent to the prefetch unit. In other words, the T bit in the DSCR controls the decode of the instruction in the ITR. After debug state entry, the debugger should clear the T bit in the DSCR to ensure that ARM instructions can be issued to the ARM10. An entry sequence for the debugger might look something like:

(enter debug state in halt mode)
Scan a 0 into the T bit of CP14 Register 1 (DSCR)
Read the CPSR in ARM mode to get the T bit information (optional)
Execute MCRs in ARM mode to extract ARM state information
Restore all the ARM state using MRCs
Move restart PC value to R0
Execute an ARM MOV R0,PC
Restore R0
(poll to ensure that the instruction has completed)
(exit debug state by issuing a RESTART command through JTAG)
Poll for Core Restarted bit
The core will use the T bit in the CPSR as the current mode upon exiting debug state.

6.0 Implementation Issues

The debug architecture is intended to be implemented with two clock domains, a fast processor clock, and a slow JTAG clock. A great deal of the debug hardware runs at the fast clock speed, and synchronization between the two is performed as the instruction and data transfer registers are read and written from the JTAG scan chains. It is possible to run the JTAG clock faster than the core clock.

Using CP14 as the source and destination for data transfers reuses existing paths within the ARM, avoiding the need to add extra inputs onto the data bus. On ARM10 the instruction register is provided as an early instruction input in the prefetch unit.

A few Multi-ICE issues came up during the course of the design which required a few tweaks to be added to the update mechanisms within the JTAG hardware. While issuing instructions to the core, the Multi-ICE software will be scanning out a bit after going through the CaptureDR state in order to verify whether or not the instruction previously issued has completed. If the instruction did not complete, the debug logic will prevent two events from happening. First, when the TAP state machine passes through the UpdateDR state, the value shifted into scan chain 5 will not be loaded into the rDTR. Second, as the TAP state machine passes through the Run/Test-Idle state to issue the instruction currently in the ITR, this instruction will not be issued to the core. The thirty-third bit of the rDTR gets registered to create a "do_update" bit, which is used to prevent the issue of the instruction and the updating of the rDTR.

More specifically, this logic is used for the following case. In order to attempt extremely fast downloads, Multi-ICE will start by scanning data into the rDTR and issuing the write to the core by going through Run-Test/Idle. For each subsequent write operation, bit 0 of the rDTR will be examined to see if the previous instruction completed. If the instruction has not finished, the debugger will present the same data again. If, after a given number of attempts the instruction still has not completed, the debugger should check the Abort Occurred bit in the DCSR to see if an abort occurred at some point. If an abort did occur during a memory access, the "do_update" bit is cleared out, preventing any subsequent instructions from being executed and another possible attempt to access memory. This is especially important if the mode suddenly changes because of the abort and memory which is not accessible in user mode becomes accessible in privileged mode.

Single stepping through code will now have to be done using the BKPT instruction, placed at the location after the next instruction to be executed. Register breakpoints can also be used.

LDC's are word-length only. It will be necessary to force the core to do the read/write for byte/halfword accesses, then move the data into R5 to be scanned out, or vice versa.

7.0 Cache (CP15) and Memory Operations

The debug unit is able to read cache information, as well as TLB information since CP14 and CP15 share some functionality. The pipeline follower and coprocessor interface all exist in the same block. This allows CP14 to update the FSR in CP15 very simply. CP15 contains sixteen registers, one of which (R15) is used as the interface for the debugger. By reading and writing to R15 using MRC and MCR instructions, the debug unit has full visibility of the caches. See the ARM1020 uA Specification for the Cache for more information.

After the state of the machine has been changed to debug state, reads of data from memory do not cause either I-Cache or D-Cache to insert new entries in the cache. In other words, no accesses are treated as cacheable. This is done by forcing the caches into a noncacheable, nonbufferable mode. Cache misses are disregarded by the HUM buffer while in debug state so that no line fills are generated.

Any program which modifies instruction data (e.g., self-modifying code) needs to flush the I-Cache after the write by the D-Cache in order to maintain coherency. When in debug mode, memory accesses in user mode will appear as user mode accesses to the memory systems and the MMUs. Memory accesses in privileged mode will appear as privileged accesses.

8.0 Debug Signals

| Name | Direction | Description |
| --- | --- | --- |
| COMMRX | Output | Communications Channel Receive. When HIGH, this signal denotes that the comms channel receive buffer contains data waiting to be read by the CPU. |
| COMMTX | Output | Communications Channel Transmit. When HIGH, this signals denotes that the comms channel transmit buffer is empty. |
| DBGACK | Output | Debug Acknowledge. When HIGH, this signal indicates the ARM1020 is in debug state. |
| DBGEN | Input | Debug Enable. This input signal allows the debug features of the ARM1020 to be disabled. This signal should be LOW only when debugging will not be required. |
| EDBGRQ | Input | External Debug Request. When driven HIGH, this causes the processor to stop when in Halt mode. |
| INSTREXEC | Output | Instruction Executed. Indicates that in the previous cycle the instruction in the execute stage of the pipeline passed its condition codes and was executed. NOT AVAILABLE IN REV0. |

9.0 JTAG Signals

| Name | Direction | Description |
| --- | --- | --- |
| IR[3:0] | Output | TAP Controller Instruction Register. These four bits reflect the current instruction loaded into the TAP controller instruction register. The bits change on the falling edge of TCK when the state machine is in the UPDATE-IR state. |

-continued

| Name | Direction | Description |
| --- | --- | --- |
| SCREG[4:0] | Output | Scan Chain Register. These five bits reflect the ID number of the scan chain currently selected by the TAP controller. These bits change on the falling edge of TCK when the TAP state machine is in the UPDATE-DR state. |
| SDOUTBS | Input | Serial Data Out from an external or Boundary Scan chain. It should be set up on the falling edge of TCK. When an external boundary scan chain is not connected, this input should be tied LOW. |
| TAPSM[3:0] | Output | TAP Controller State Machine. This bus reflects the current state of the TAP controller state machine. These bits change off the rising edge of TCK. |
| TCK | Input | The JTAG clock (the test clock). |
| TDI | Input | Test Data Input; the JTAG serial input. |
| TDO | Output | Test Data Output; the JTAG serial output; |
| NTDOEN | Output | Not TDO Enable. When LOW, this signal denotes that serial data is being driven out on the TDO output. nTDOEN would normally be used as an output enable for a TDO pin in a packaged part. |
| TMS | Input | Test Mode Select. TMS selects to which state the TAP controller state machine should change. |
| nTRST | Input | Not Test Reset. Active-low reset signal for the boundary scan logic. This pin must be pulsed or driven LOW after power up to achieve normal device operation, in addition to the normal device reset (nRESET). |

Although a particular embodiment of the invention has been described herewith, it will be apparent that the invention is not limited thereto, and that many modifications and additions may be made within the scope of the invention. In addition, various combinations of the features of the following dependent claims could be made with the features of the independent claims without departing from the scope of the present invention.

We claim:

1. Apparatus for processing data, said apparatus comprising:
    a main processor operable in a non-debug state to execute data processing instructions to perform normal data processing operations;
    an instruction transfer register for holding the data processing instruction and accessible via a first serial scan chain;
    a data transfer register for holding a data value and accessible via a second serial scan chain;
    debug logic for controlling said main processor, said instruction transfer register and said data transfer register such that a data processing instruction held within said instruction transfer register is passed a plurality of times to said main processor for execution upon a sequence of data values scanned into or from said data transfer register via said second serial scan chain.

2. Apparatus as claimed in claim 1, wherein said debug logic includes a scan chain controller for controlling said instruction transfer register and said data transfer register.

3. Apparatus for processing data, said apparatus comprising:
    a main processor;
    an instruction transfer register for holding the data processing instruction and accessible via a first serial scan chain;
    a data transfer register for holding a data value and accessible via a second serial scan chain;

debug logic for controlling said main processor, said instruction transfer register and said data transfer register such that a data processing instruction held within said instruction transfer register is passed a plurality of times to said main processor for execution upon a sequence of data values scanned into or from said data transfer register via said second serial scan chain, comprising a memory circuit and wherein said data processing instruction is a memory access instruction for transferring a data value between said memory circuit and said data transfer register.

4. Apparatus as claimed in claim 3, wherein said memory access instruction is executed a plurality of times to provide a block data transfer.

5. Apparatus for processing data, said apparatus comprising:

a main processor;

an instruction transfer register for holding the data processing instruction and accessible via a first serial scan chain;

a data transfer register for holding a data value and accessible via a second serial scan chain;

debug logic for controlling said main processor, said instruction transfer register and said data transfer register such that a data processing instruction held within said instruction transfer register is passed a plurality of times to said main processor for execution upon a sequence of data values scanned into or from said data transfer register via said second serial scan chain, wherein said data transfer register is specified for manipulation by an operand within one or more data processing instructions.

6. Apparatus as claimed in claim 5, wherein said debug logic includes a debug coprocessor coupled to said main processor by a coprocessor bus and said data transfer register is an addressable debug coprocessor register.

7. Apparatus for processing data, said apparatus comprising:

a main processor;

an instruction transfer register for holding the data processing instruction and accessible via a first serial scan chain;

a data transfer register for holding a data value and accessible via a second serial scan chain;

debug logic for controlling said main processor, said instruction transfer register and said data transfer register such that a data processing instruction held within said instruction transfer register is passed a plurality of times to said main processor for execution upon a sequence of data values scanned into or from said data transfer register via said second serial scan chain, wherein said data transfer register comprises a first data transfer register that is writable from said second serial scan chain and readable by said main processor and a second data transfer register that is readable by said second serial scan chain and writable from said main processor.

8. Apparatus for processing data, said apparatus comprising:

a main processor;

an instruction transfer register for holding the data processing instruction and accessible via a first serial scan chain;

a data transfer register for holding a data value and accessible via a second serial scan chain;

debug logic for controlling said main processor, said instruction transfer register and said data transfer register such that a data processing instruction held within said instruction transfer register is passed a plurality of times to said main processor for execution upon a sequence of data values scanned into or from said data transfer register via said second serial scan chain, wherein said data transfer register includes an instruction complete flag settable by said main processor for indicating that said data processing instruction has completed an execution iteration.

9. Apparatus for processing data, said apparatus comprising:

a main processor;

an instruction transfer register for holding the data processing instruction and accessible via a first serial scan chain;

a data transfer register for holding a data value and accessible via a second serial scan chain;

debug logic for controlling said main processor, said instruction transfer register and said data transfer register such that a data processing instruction held within said instruction transfer register is passed a plurality of times to said main processor for execution upon a sequence of data values scanned into or from said data transfer register via said second serial scan chain, wherein said second serial scan chain is operable to output bits of a data value to be transferred out of said data transfer register at the same time as storing bits of a data value to be transferred into said data transfer register.

10. A method of processing data in a device including a main processor operable in a non-debug mode to execute data processing instructions to perform normal data processing operations, said method comprising the steps of:

holding a data processing instruction accessible via a first serial scan chain in an instruction transfer register;

holding a data value accessible via a second serial scan chain in a data transfer register; and controlling said main processor, said instruction transfer register and said data transfer register such that a data processing instruction held within said instruction transfer register is passed a plurality of times to said main processor for execution upon a sequence of data values scanned into or from said data transfer register via said second serial scan.

11. Apparatus for processing data, said apparatus comprising:

a main processor operable in a non-debug state to execute data processing instructions to perform normal data processing operations;

an instruction transfer register for holding the data processing instruction and accessible via a first serial scan chain;

a data transfer register for holding a data value and accessible via a second serial scan chain;

a debug controller for controlling said main processor, said instruction transfer register and said data transfer register such that a data processing instruction held within said instruction transfer register is passed a plurality of times to said main processor for execution upon a sequence of data values scanned into or from said data transfer register via said second serial scan chain.

12. Apparatus as claimed in claim 11, comprising a memory circuit and wherein said data processing instruction is a memory access instruction for transferring a data value between said memory circuit and said data transfer register.

13. Apparatus as claimed in claim 12, wherein said memory access instruction is executed a plurality of times to provide a block data transfer.

14. Apparatus as claimed in claim 11, wherein said data transfer register is specified for manipulation by an operand within one or more data processing instructions.

15. Apparatus as claimed in claim 14, wherein said debug controller includes a debug coprocessor coupled to said main processor by a coprocessor bus and said data transfer register is an addressable debug coprocessor register.

16. Apparatus as claimed in claim 11, wherein said data transfer register comprises a first data transfer register that is writable from said second serial scan chain and readable by said main processor and a second data transfer register that is readable by said second serial scan chain and writable from said main processor.

17. Apparatus as claimed in claim 11, wherein said data transfer register includes an instruction complete flag settable by said main processor for indicating that said data processing instruction has completed an execution iteration.

18. Apparatus as claimed in claim 11, wherein said second serial scan chain is operable to output bits of a data value to be transferred out of said data transfer register at the same time as storing bits of a data value to be transferred into said data transfer register.

19. Apparatus as claimed in claim 11, wherein said debug controller includes a scan chain controller for controlling said instruction transfer register and said data transfer register.

* * * * *